United States Patent
Hiramoto et al.

(10) Patent No.: US 6,950,333 B2
(45) Date of Patent: Sep. 27, 2005

(54) MAGNETIC MEMORY AND METHOD FOR DRIVING THE SAME, AND MAGNETIC MEMORY DEVICE USING THE SAME

(75) Inventors: Masayoshi Hiramoto, Ikoma (JP); Nozomu Matsukawa, Nara (JP); Akihiro Odagawa, Nara (JP); Mitsuo Satomi, Katano (JP); Yasunari Sugita, Osaka (JP); Yoshio Kawashima, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 131 days.

(21) Appl. No.: 10/695,731

(22) Filed: Oct. 24, 2003

(65) Prior Publication Data

US 2004/0085807 A1 May 6, 2004

Related U.S. Application Data

(63) Continuation of application No. PCT/JP02/06093, filed on Jun. 19, 2002.

(30) Foreign Application Priority Data

Jun. 19, 2001 (JP) ........................................ 2001-184480

(51) Int. Cl.[7] .............................................. G11C 11/00
(52) U.S. Cl. ........................ 365/158; 365/171; 365/173
(58) Field of Search ................................ 365/158, 171, 365/173, 148, 161

(56) References Cited

U.S. PATENT DOCUMENTS

| 5,930,164 A | 7/1999 | Zhu |
| 6,169,689 B1 | 1/2001 | Naji |
| 6,335,236 B1 | 1/2002 | Mori |
| 6,351,408 B1 * | 2/2002 | Schwarzl et al. ........... 365/158 |
| 6,522,573 B2 * | 2/2003 | Saito et al. ................. 365/158 |
| 6,587,370 B2 * | 7/2003 | Hirai ........................... 365/171 |
| 2001/0026470 A1 | 10/2001 | Gillies |
| 2002/0149962 A1 | 10/2002 | Horiguhi |

FOREIGN PATENT DOCUMENTS

| JP | 8-306014 | 11/1996 |
| JP | 11-354728 | 12/1999 |
| JP | 2001-338487 | 12/2001 |
| TW | 495745 | 3/1991 |

OTHER PUBLICATIONS

Roy Scheuerlein et al., "ISSCC 2000| Session 7 | TD: Emerging Memory & Device Technologies |Paper TA 7.2", in 2000 IEEE International Solid–State Circuits Conference, Digest of Technical Papers, pp 128–129.

M. Durlam et al., "ISSCC 2000 | Session 7 | TD: Emerging Memory & Device Technologies | Paper TA 7.3", in 2000 IEEE International Solid–State Circuits Conference, 2000 IEEE, Digest of Technical Papers, PP 130–131.

* cited by examiner

*Primary Examiner*—Anh Phung
*Assistant Examiner*—Toan Le
(74) *Attorney, Agent, or Firm*—Hamre, Schumann, Mueller & Larson, P.C.

(57) ABSTRACT

A magnetic memory of the present invention includes two or more memory layers and two or more tunnel layers that are stacked in the thickness direction of the layers. The two or more memory layers are connected electrically in series. A group of first layers includes at least one layer selected from the two or more memory layers. A group of second layers includes at least one layer selected from the two or more memory layers. A resistance change caused by magnetization reversal in the group of first layers differs from a resistance change caused by magnetization reversal in the group of second layers.

25 Claims, 22 Drawing Sheets

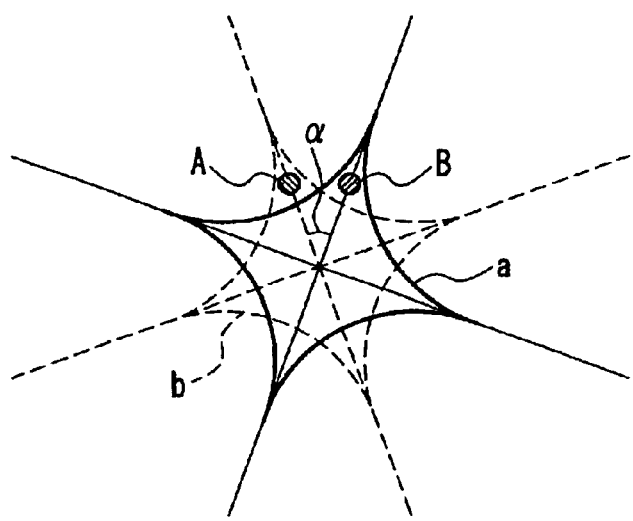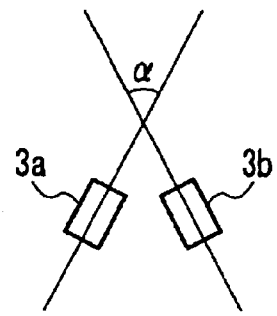
FIG. 17A          FIG. 17B
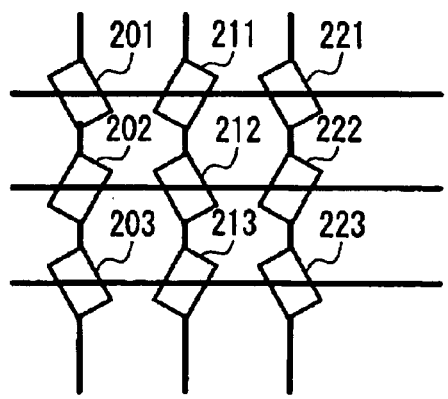
FIG. 18

First Layer + Second Layer

First Layer

Second Layer

MAGNETIC MEMORY AND METHOD FOR DRIVING THE SAME, AND MAGNETIC MEMORY DEVICE USING THE SAME

BACKGROUND OF THE INVENTION

1. Field of the Invention

The present invention relates to a magnetic memory and a method or driving the magnetic memory. The present invention also relates to a magnetic memory device using the magnetic memory, e.g., a magnetic random access memory (MRAM).

2. Description of the Related Art

A tunnel magnetoresistance (TMR) element includes a tunnel (barrier) layer and a pair of magnetic layers sandwiching the tunnel layer. The TMR element utilizes a spin tunnel effect that depends on a difference in relative angle formed by the magnetization directions of the magnetic layers. A spin valve TMR element includes a pinned layer and a free layer as a pair of magnetic layers. The magnetization of the pinned layer is relatively hard to rotate, and the magnetization of the free layer is relatively easy to rotate. The free layer functions as a memory layer whose magnetization direction is used for recording information.

When an MRAM includes the TMR elements as magnetic memories in matrix form, the following problems are expected to arise with a higher integration density.

1. A reduction in space between the elements causes magnetic crosstalk and thus results in recording errors.

2. A magnetic switching field and a recording current are increased with decreasing size of the magnetic body.

3. The recording current is limited as wiring becomes finer.

4. A rise in resistance due to finer wiring reduces a S/N ratio for reading.

These problems may impede the achievement of an even higher integration density (e.g., Gbit/in$^2$ or more).

SUMMARY OF THE INVENTION

A magnetic memory of the present invention includes two or more memory layers and two or more tunnel layers that are stacked in the thickness direction of the layers. The two or more memory layers are connected electrically in series. A group of first layers includes at least one layer selected from the two or more memory layers. A group of second layers includes at least one layer selected from the two or more memory layers. A resistance change $\Delta R_1$ caused by magnetization reversal in the group of first layers differs from a resistance change $\Delta R_2$ caused by magnetization reversal in the group of second layers.

The present invention can provide a multivalued magnetic memory. A multivalued memory can record information with high density while not miniaturizing the memory. The magnetic memory of the present invention allows for non-destructive reading of information. The resistance change of the memory can be measured as a voltage/current change caused by the application of constant voltage/constant current.

The present invention also provides a driving method suitable for the above magnetic memory. According to the driving method, the magnetization reversal of a memory layer is performed using a magnetic field that is produced by a plurality of currents including a current flowing through the memory layer in its thickness direction. When this driving method is applied to a magnetic memory of the present invention, the current flows through at least one layer that is to be reversed magnetically and selected from the two or more memory layers in the thickness direction. The above driving method can be applied basically to all magnetoresistive elements that allow a current to flow in the thickness direction of the layers and any magnetic memories including the magnetoresistive elements. Therefore, the driving method is not limited only to a TMR element, but also used for a so-called CPP (Current Perpendicular to Plane)—GMR element.

The present invention can achieve smooth magnetization reversal, which is effective in reducing recording errors for a highly integrated magnetic memory.

BRIEF DESCRIPTION OF THE DRAWINGS

FIGS. 17A and 17B show the inclination of a magnetic switching curve that corresponds to an angle a between the easy axes of magnetization of memory layers, and magnetization reversal by a synthetic magnetic field in this condition.

FIG. 18 is a plan view showing an example of the relationship between easy axes of magnetization of the memory layers arranged in the in-plane direction in a magnetic memory device of the present invention.

FIG. 20A is a cross-sectional view of a magnetic memory. FIG. 20B shows the relationship between a recording current and time. FIG. 20C is a plan view of a memory layer.

FIG. 21A shows a writing operation. FIG. 21B shows a reading operation.

FIG. 22A shows a writing operation. FIG. 22B shows a reading operation.

DESCRIPTION OF THE PREFERRED EMBODIMENTS

Figure 1A:
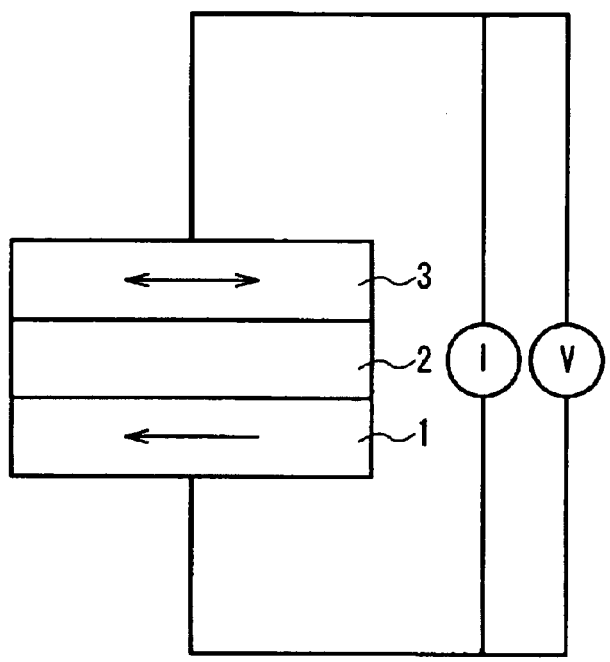
FIGS. 1A and 1B are cross-sectional views, each showing the basic configuration of a magnetoresistive element that can be used in a magnetic memory of the present invention.

In a magnetic memory of the present invention, a group of first layers and a group of second layers are selected from a plurality of memory layers, and the resistance change $\Delta R_1$ of the group of first layers differs from the resistance change $\Delta R_2$ of the group of second layers. The number of memory layers included in the groups is not particularly limited, and both of the groups may consist of a single memory layer.

It is preferable that $\Delta R_1$ and $\Delta R_2$ satisfy the relationship expressed by $$\Delta R_1 \times 2 \leq \Delta R_2 \quad (1)$$

where $\Delta R_1 < \Delta R_2$.

When the relationship (1) is established, the outputs of two groups of memory layers can be separated easily.

The magnetic memory of the present invention may include two or more magnetoresistive elements (TMR elements) that are stacked in the thickness direction of the layers. Each of the TMR elements includes at least one memory layer and at least one tunnel layer that constitute the magnetic memory. The magnetic memory may include two or more recording conductors for writing information. In this case, it is preferable that at least one recording conductor selected from the two or more recording conductors is arranged between a pair of adjacent TMR elements selected from the two or more TMR elements. It is further preferable that the TMR element is arranged alternately with at least one recording conductor. This is because the amount of current needed for magnetization reversal can be reduced as a distance between the recording conductor and the memory layer is reduced.

An embodiment of the magnetic memory of the present invention may include two or more TMR elements that are stacked in the thickness direction of the layers, and the two or more TMR elements may include two TMR elements with different outputs.

In this magnetic memory, the recording conductors may be arranged so as to sandwich each of the TMR elements. A memory including N TMR elements may require at least (N+1) recording conductors, where N is an integer of not less than 2.

The TMR element may include either a single memory layer or a plurality of memory layers. In the latter case, the TMR element may include at least two layers selected from the memory layers of the magnetic memory. This TMR element also may include at least two tunnel layers. In this case, at least two memory layers of the TMR element may include two memory layers with different resistance changes due to magnetization reversal.

Another embodiment of the magnetic memory of the present invention may include a TMR element including at least two memory layers that are stacked in the thickness direction of the layers and differ from each other in output.

Two memory layers that exhibit different resistance changes due to magnetization reversal can be produced, e.g., by forming two tunnel layers in different thicknesses. The tunnel resistance of a laminate (pinned layer/tunnel layer/memory layer (free layer)) changes with the thickness of the tunnel layer, and the spin tunnel effect is affected as well. Therefore, even if a tunnel resistance change ratio is constant under the magnetization reversal, the resistance change of one memory layer can be different from that of the other memory layer because of such a change in tunnel resistance. The thickness control of the tunnel layer is one of the methods for controlling a resistance change due to magnetization reversal of the memory layer.

When the magnetic memory of the present invention includes N memory layers, it can provide a maximum of $2^N$ resistance changes (N is an integer of not less than 2). In other words, the magnetic memory of the present invention can be up to a $2^N$-valued memory.

When the resistance change of the Nth memory layer is represented by $\Delta R_N$, the minimum value of $\Delta R_N$ is represented by $\Delta R_{min}$, and the maximum value of $\Delta R_N$ is represented by $\Delta R_{max}$, it is preferable that $\Delta R_{min}$ and $\Delta R_{max}$ satisfy the relationship expressed by $$\Delta R_{max} \geq \Delta R_{min} \times 2^{N-1} \quad (2)$$

where N is an integer of not less than 2.

When the Mth smallest $\Delta R_N$ is represented by $\Delta R_M$, it is preferable that $\Delta R_M$ satisfies the relationship expressed by $$\Delta R_M \times 2 \leq \Delta R_{M+1} \quad (3)$$

where M is an integer of 1 to (N−1).

When a constant current I flows in the thickness direction of two or more memory layers included in the magnetic memory, the magnetization of the Nth memory layer is reversed to provide an output change I$\Delta$R. If the relationship (2) and/or (3) is established, the output change caused by the magnetization reversal of each memory layer can be separated easily while achieving a multivalued memory.

It is preferable that $I\Delta R_{min}$ is set to not less than a detection limit. The suitable value of $I\Delta R_{min}$ is not less than 50 mV, although it depends on a detecting element.

In the above relationships, N is not particularly limited and preferably is about 2 to 10 in consideration of the operating speed, output, cost, etc. When N is too large, the total resistance of the magnetic memory increases to the extent that RC delay or the like cannot be ignored. Moreover, the output is reduced, and the manufacturing yield is lowered because the surface roughness of each layer is increased with the number of layers.

The magnetic memory preferably includes a pair of memory layers that are adjacent to each other in the thickness direction of the layers so that the direction of an easy axis of magnetization of one of the pair of memory layers differs from the direction of an easy axis of magnetization of the other of the pair of memory layers. The angle between the easy axes of magnetization preferably ranges from 20° to 90°. The adjustment of the easy axis of magnetization makes it easier to control the magnetization reversal of each memory layer and to prevent malfunction.

It is preferable that the magnetic memory of the present invention is controlled by a nonlinear element connected electrically to two or more memory layers. Examples of the nonlinear element include a switching element and a rectifier element. When two or more TMR elements are connected in series, and at least one recording conductor is arranged between each of the TMR elements so as to make electrical connection with the TMR elements, the nonlinear element (e.g., a rectifier element) may be located between each of the recording conductors. This can facilitate the control of a current flowing through the elements.

When the magnetic memory is used as a magnetic memory device (memory device), e.g., MRAM, a plurality of memories may be arranged in the in-plane direction of the layers. This memory device preferably includes a pair of memory layers that are adjacent to each other in the in-plane direction of the layers so that the direction of an easy axis of magnetization of one of the pair of memory layers differs from the direction of an easy axis of magnetization of the other of the pair of memory layers. As with the case described above, the angle between the easy axes of magnetization preferably ranges from 20° to 90°. The magnetic memory also can be used, e.g., in a system LSI.

A driving method of the present invention uses a current flowing through at least a memory layer that is to be reversed magnetically, in the thickness direction of this memory layer. In addition to this current (first current), a second current also can be used that flows in the in-plane direction of the layers and produces a magnetic field along the magnetization direction after the magnetization reversal. In this case, it is preferable that the application of the second current is started after the application of the first current is started. It is also preferable that the application of the second current is ended after the application of the first current is ended. Smoother reversal of magnetization can be achieved by adjusting the start and/or end of the current application. The magnetic field produced by the second current preferably acts on the surface of the memory layer in the same direction as the magnetization direction of the memory layer after the magnetization has been reversed.

A third current that flows in the in-plane direction of the layers, but in a different direction from the second current, also can be used to apply a magnetic field. In this case, it is preferable that the application of the second current is started after the application of the third current is started. It is also preferable that the application of the second current is ended after the application of the third current is ended. As with the case described above, this contributes to smoother reversal of magnetization.

The first and third currents can be applied simultaneously or used as currents split from the same recording conductor. When the first current is separated from the third current, it is preferable that a magnetic field produced by the, third current before the separation of the first current and a magnetic field produced by the first current act to rotate the magnetization of a memory layer that is to be reversed magnetically in the same direction.

Moreover, the magnetizations of two layers may be reversed simultaneously by the application of at least a magnetic field produced by a current flowing through a conductor that lies between the two layers.

Hereinafter, embodiments of the present invention will be described in more detail with reference to the drawings.

Figure 1B:
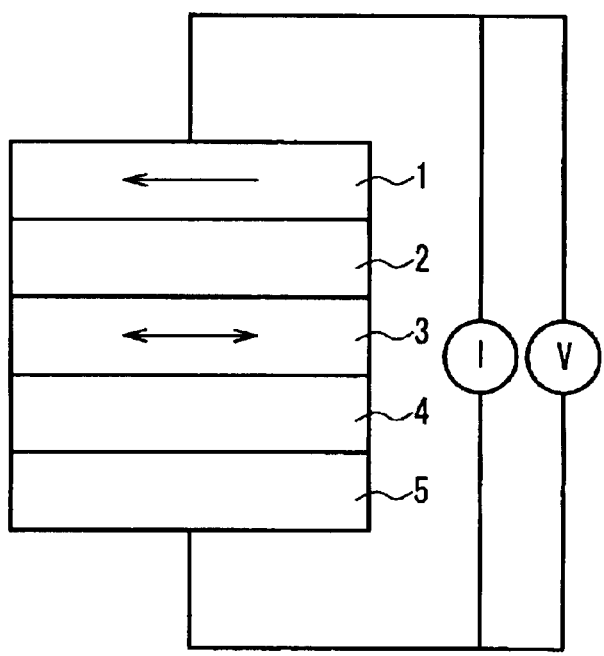

FIGS. 1A and 1B show the configuration of a magnetoresistive element that can be used in a magnetic memory of the present invention. The magnetoresistive element (TMR element) includes at least one tunnel layer 2 and two ferromagnetic layers 1, 3 sandwiching the tunnel layer 2 (FIG. 1A). In this TMR element, a relative angle formed by the magnetization directions of a free layer (memory layer) 3 and a pinned layer 1 changes with a change in magnetization direction of the free layer 3. Such a change in the relative angle of magnetizations can be detected as a voltage/current change of a circuit that partly includes the layers 1, 2, and 3.

The TMR element may include additional layers, e.g., a bias tunnel layer 4 and a non-magnetic conductive layer 5 (FIG. 1B). The bias tunnel layer 4 can improve the bias dependence of a MR ratio.

The TMR element may include a plurality of pinned layers or free layers. This type of TMR element is, e.g., an element that includes a laminate of pinned layer/tunnel layer/free layer/tunnel layer/pinned layer or a laminate of free layer/tunnel layer/pinned layer/tunnel layer/free layer.

When the free layer (memory layer) 3 has uniaxial or multiaxial anisotropy, the magnetization direction is in a bistable or multistable state. The free layer 3 stores the magnetization direction as information even after an externally applied magnetic field is removed. In general, the larger the relative angle of magnetizations is, the higher a magnetoresistance change ratio (NM ratio) becomes. Therefore, it is preferable that the magnetization direction of the free layer 3 is in the bistable state, i.e., an easy axis of magnetization is set by imparting uniaxial anisotropy to the free layer 3. In the bistable state, the magnetization direction of the free layer 3 is switched between parallel (the same direction) and antiparallel (the opposite direction) with respect to the magnetization direction of the pinned layer 1 by the application of an external magnetic field.

The uniaxial anisotropy can be introduced by shape anisotropy that is derived from the shape of a layer. However, other methods also can be used to introduce anisotropy, such as the heat treatment of a free layer in a magnetic field, the deposition of a free layer in a magnetic field, and the oblique deposition.

It is preferable that the pinned layer 1 is coupled magnetically, e.g., to a layer with a high coercive force, a laminated ferrimagnetic material, or an antiferromagnetic layer at the opposite side to the tunnel layer 2 so that the magnetization direction is hard to rotate.

The layer with a high coercive force may be made of materials having a coercive force of not less than 100 Oe, such as CoPt, FePt, CoCrPt, CoTaPt, FeTaPt, and FeCrPt. The antiferromagnetic layer may be made of Mn-containing antiferromagnetic materials such as PtMn, PtPdMn, FeMn, IrMn, and NiMn. The laminated ferrimagnetic material is a laminate of a magnetic film and a non-magnetic film. As the magnetic film, e.g., Co or Co alloys such as FeCo, CoFeNi, CoNi, CoZrTa, CoZrB, and CoZrNb can be used. As the non-magnetic film, a film that has a thickness of about 0.2 to 1.1 nm and made of Cu, Ag, Au, Ru, Rh, Ir, Re or Os, or an alloy or oxide of these metals can be used.

It is preferable that both of the magnetic layers 1, 3 are made of the following materials at least in the vicinity of interface with the tunnel layer:

(1) Fe, Co, Ni, a FeCo alloy, a NiFe alloy, a CoNi alloy, or NiFeCo alloy;

(2) A compound expressed by TMA, where T is at least one element selected from Fe, Co, and Ni, M is at least one element selected from Mg, Ca, Ti, Zr, Hf, V, Nb, Ta, Cr, Al, Si, Mg, Ge, and Ga, and A is at least one element selected from N, B, O, F, and C, e.g., FeN, FeTiN, FeAlN, FeSiN, FeTaN, FeCoN, FeCoTiN, FeCo(Al, Si)N, or FeCoTaN;

(3) A compound expressed by (Co, Fe)E, where E is at least one element selected from Ti, Zr, Hf, V, Nb, Ta, Cu, and B;

(4) A compound expressed by TL, where T is at least one element selected from Fe, Co, and Ni, and L is at least one element selected from Cu, Ag, Au, Pd, Pt, Rh, Ir, Ru, Os, Ru, Si, Ge, Al, Ga, Cr, Mo, W, V, Nb, Ta,Ti, Zr, Hf, La, Ce, Pr, Nd, Pm, Sm, Eu, Gd, Tb, Dy, Ho, Er, Tm, Yb, and Lu, e.g., FeCr, FeSiAl, FeSi, FeAl, FeCoSi, FeCoAl, FeCoSiAl, FeCoTi, Fe(Ni)(Co)Pt, Fe(Ni)(Co)Pd, Fe(Ni)(Co)Rh, Fe(Ni)(Co)Ir, Fe(Ni)(Co)Ru, or FePt;

(5) A half-metallic material typified by $Fe_3O_4$, a material expressed by XMnSb, where X is at least one element selected from Ni, Cu, and Pt, LaSrMnO, LaCaSrMnO, and $CrO_2$;

(6) A magnetic semiconductor typified by QDJ or RDG: for QDJ, Q is at least one element selected from Sc, Y, lanthanide, Ti, Zr, Hf, V, Nb, Ta, Cr, Ni, and Zn, D is at least one element selected from V, Cr, Mn, Fe, Co, and Ni, and J is at least one element selected from C, N, O, F,and S; for RDG, R is at least one element selected from B, Al, Ga, Ga, and In, D is the same as described above, and G is at least one element selected from C, N, O, P, and S, e.g., GaMnN, AlMnN, GaAlMnN, or AlBMnN;

(7) A perovskite-type oxide, a spinel-type oxide (e.g., ferrite), or a garnet-type oxide; and (8) An oxide of alkaline-earth metal, e.g., $CaB_6$ or CaMgB, or a ferromagnetic material obtained by adding lanthanide such as La to the oxide.

The tunnel layer 2 and the bias tunnel layer 4 are not particularly limited as long as they are made of an insulator or semiconductor. A preferred material is a compound of an element selected from Groups IIa to VIa (Groups 2 to 6 in new IUPAC system) including Mg, Ti, Zr, Hf, V, Nb, Ta, and Cr, lanthanide including La and Ce, and Groups IIb to IVb (Groups 12 to 14) including Zn, B, Al, Ga, and Si, and at least one element selected from F, O, C, N, and B. A typical insulator for the tunnel layer is an Al oxide, an Al nitride, or an Al oxynitride.

Figure 2:
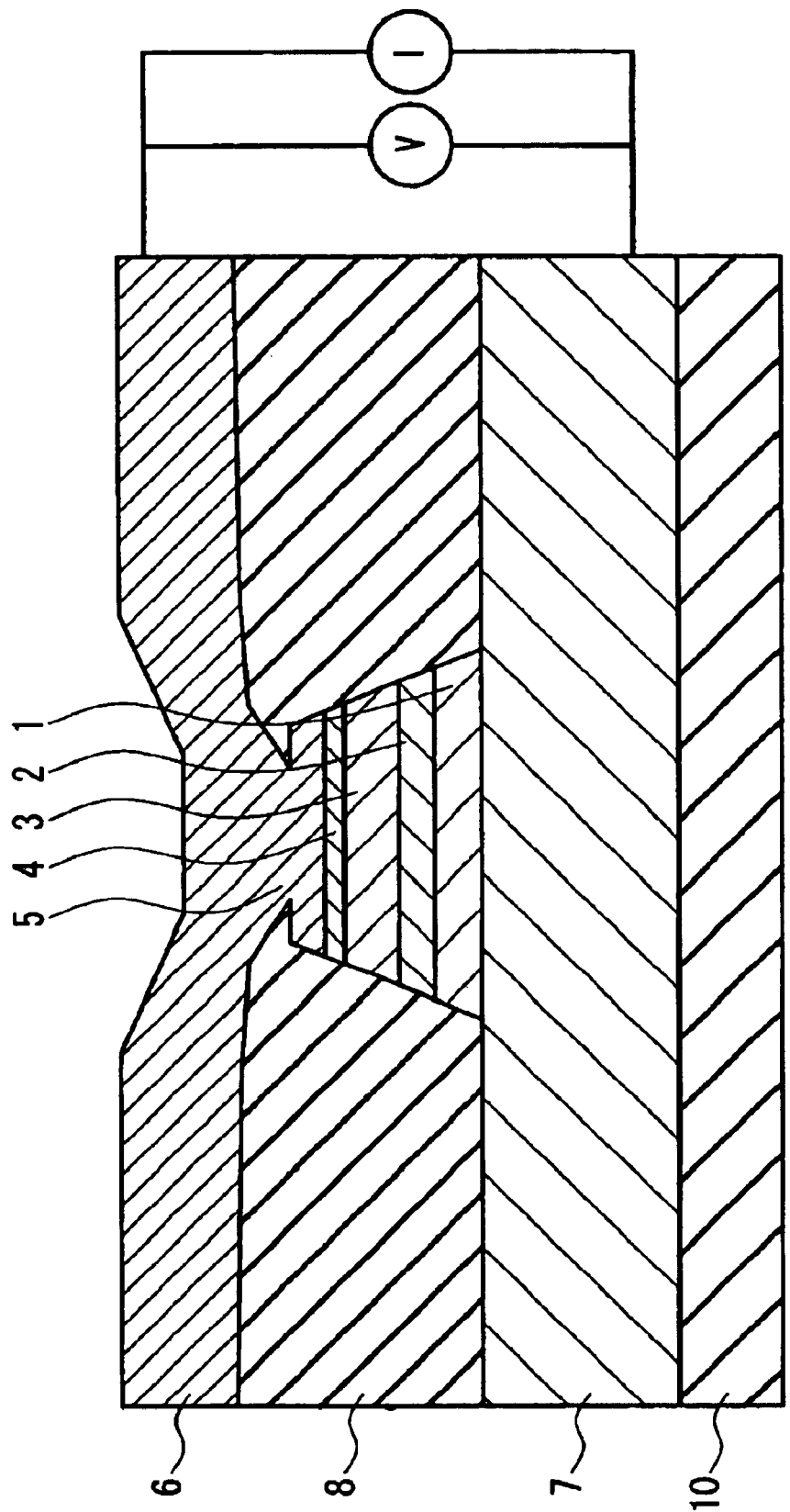
FIG. 2 is a cross-sectional view showing the basic configuration of a magnetoresistive element that can be used in a magnetic memory of the present invention, together with the members around the magnetoresistive element.

The magnetoresistive element actually constitutes part of a multilayer film formed on a substrate 10 (FIG. 2). For example, the element shown in FIG. 1B is formed between a pair of electrodes 6, 7, and an interlayer insulating film 8 is arranged between the electrodes.

The multilayer film can be formed by general methods such as various types of sputtering, MBE (molecular beam epitaxy), and ion plating. Example of the various types of sputtering include pulse laser deposition (PLD), ion beam deposition (IBD), cluster ion beam, RF, DC, ECR (electron cyclotron resonance), helicon, ICP (inductively coupled plasma), and facing target sputtering. In addition to these PVD (physical vapor deposition) methods, CVD (chemical vapor deposition), plating, a sol-gel process, or the like can be used as well.

The tunnel layer may be produced, e.g., by allowing a thin film precursor made of a predetermined metal or alloy to react in an appropriate atmosphere containing certain elements, molecules, ions, or radicals. Specifically, the tunnel layer may be produced by fluoridation, oxidation, carbonization, nitrization, or boration of the thin film precursor. A non-stoichiometric compound that includes F, O, C, N, or B in an amount of not more than the stoichiometric ratio may be used as the thin film precursor.

For example, when an $Al_2O_3$ film is formed as the tunnel insulating layer, Al or AlOx (x≦1.5) can be deposited in an inert-gas atmosphere or $Ar+O_2$ atmosphere, and then oxidized in the presence of $O_2$ or $O_2$+inert gas. The oxidation or the like may be performed by generating plasma.

For micro-fabrication of the films thus formed, methods used in a semiconductor process or GMR head manufacturing process can be employed. The methods include physical or chemical etching techniques such as ion milling, RIE (reactive ion etching), and FIB (focused ion beam), a stepper technique for forming fine patterns, and photolithography using, e.g., an EB method. Moreover, CMP (chemical mechanical polishing) or cluster ion beam etching also can be used to flatten the surface of the electrodes or the like.

Figure 3A:
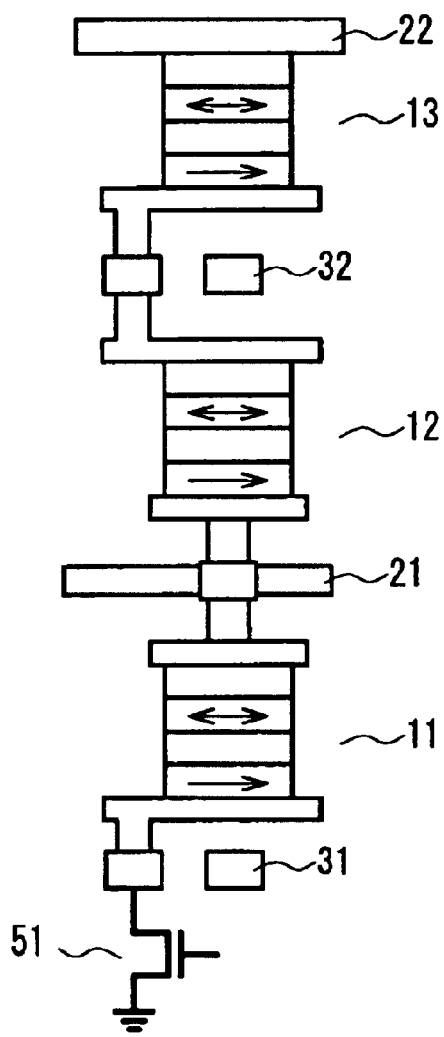
FIGS. 3A and 3B are cross-sectional views showing an embodiment of a magnetic memory of the present invention when observed from two directions 90 degrees apart from each other.
Figure 3B:
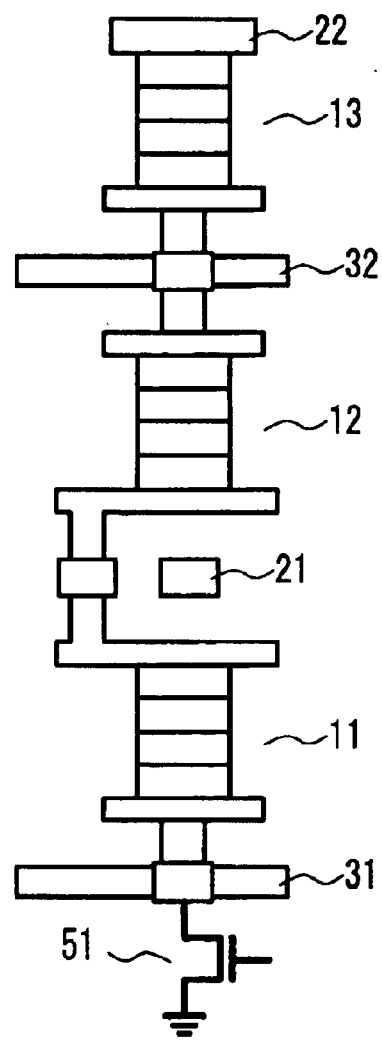

According to the present invention, e.g., a plurality of magnetoresistive elements 11, 12, 13 are stacked on a substrate, and recording conductors are arranged between the elements (FIGS. 3A and 3B). The magnetoresistive element as shown in FIG. 1B is used in FIGS. 3A and 3B.

The elements 11, 12, 13 constitute a group of elements connected electrically in series. The group of elements is connected to a MOSFET, represented by a switching element 51. A rectifier element or the like, e.g., a diode, a coulomb blockade element, or a tunnel diode may be used instead of the switching element.

The nonlinear elements, such as a switching element and a rectifier element, serve to electrically separate the adjacent groups of elements. When the nonlinear elements are not used, sensitivity can be maintained, e.g., by dividing memory cells into blocks, each of which has a maximum of about 10,000 cells, and electrically separating one block from the other block.

A magnetic field is applied to the element 11 basically through a word line 31 and a bit line 21. Similarly, the bit line 21 and a word line 32 are used for the element 12, and the word line 32 and a bit line 22 are used for the element 13. In this memory, a pair of recording conductors (the word line and the bit line) is arranged so as to sandwich each of the elements, and a synthetic magnetic field produced by a current flowing through the conductors is applied to the individual elements.

The angle formed by the direction in which the word lines 31, 32 extend and the direction in which the bit lines 21, 22 extend is 90°, and the word lines and the bit lines are in the state of so-called "skew lines". The direction of the word lines 31, 32 and the direction of the bit lines 21, 22 are perpendicular while not intersecting. In this memory, the word lines 31, 32 are isolated electrically from each of the elements. However, the bit lines 21, 22 are connected electrically to each of the elements and also used as sense lines for reading information. The conductors including the word lines and the bit lines may be made of Cu, Al, or the like.

In this embodiment, the elements are connected in series, and the word lines and the bit lines are arranged alternately between the elements so that the word lines extend in a direction perpendicular to the direction of the bit lines. Thus, a magnetic field for recording information can be applied efficiently to each of the elements.

Figure 4:
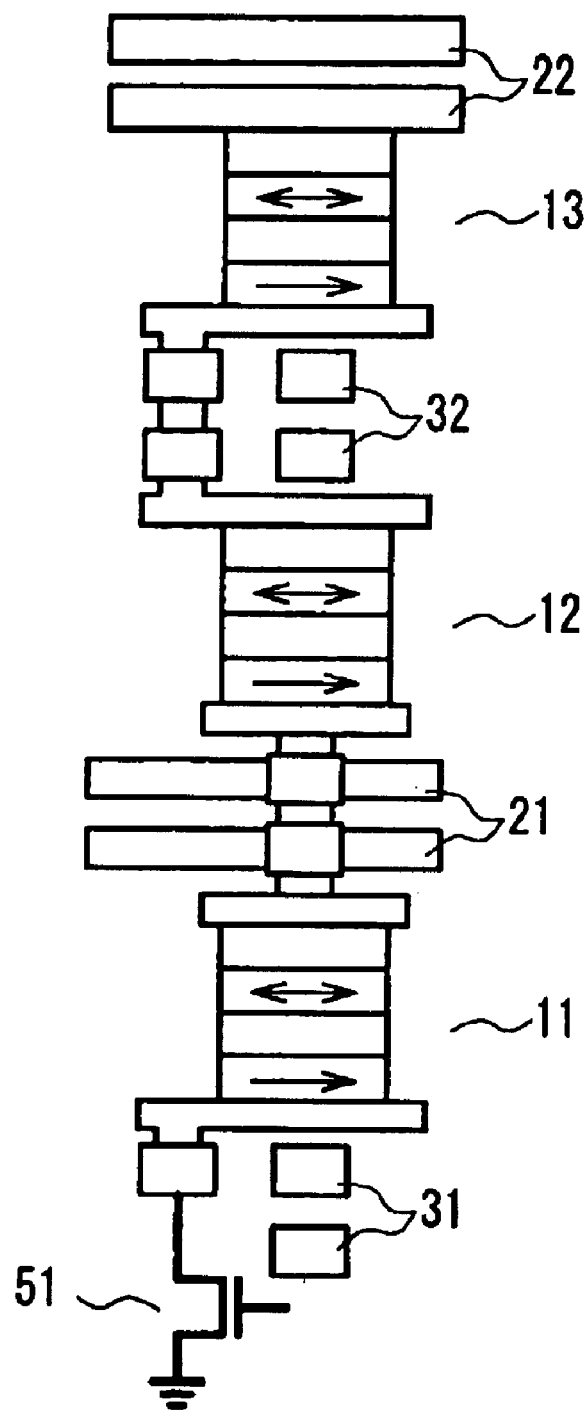
FIG. 4 is a cross-sectional view showing another embodiment of a magnetic memory of the present invention.

The recording conductors are not limited to a single wire, and can be two or more parallel wires (FIG. 4). A memory shown in FIG. 4 includes word lines 31, 32 and bit lines 21, 22, each of which includes two wires. This embodiment is suitable for information recording at a high frequency (e.g., not less than 200 MHz) compared with the embodiment using the recording conductors of a single wire (FIGS. 3A and 3B). When two or more wires are used as a recording conductor, it is preferable that at least one wire should be maintained at a constant potential, e.g., a ground potential.

Information may be written simultaneously into a plurality of elements. When the elements 11, 13 are selected in writing information composed of a plurality of bits, recording errors caused by magnetic crosstalk or the like tend to be suppressed because no recording conductor is common to the elements 11, 13. In view of power consumption, however, it is advantageous to select the elements 11, 12 (12, 13) that have a common recording conductor.

When two or more bits are recorded at the same time, there is a possibility that the momentary maximum power consumption exceeds the tolerance of power supply. In such a case, a capacitor may be connected in parallel with the power supply and charged while a recording current is not generated. At the time of writing, a recording current may be supplied simultaneously from the power supply and the capacitor or the capacitor alone.

The following is an explanation of the amount of information that can be written into the magnetic memories as shown in FIGS. 3A, 3B, and 4. Taking voltage detection as an example, the output change of a magnetoresistive element can be represented by $\Delta P$ ($\Delta P = I \times \Delta R$, where $\Delta R$ is a resistance change). When the output change of the element 11 is $\Delta P_1$, the output change of the element 12 is $\Delta P_2$ ($\Delta P_2 = 2\Delta P_1$), and the output change of the element 13 is $\Delta P_3$ ($\Delta P_3 = 3\Delta P_1$), the magnetic memory can have 7 memory values (FIG. 5).

Figure 6:
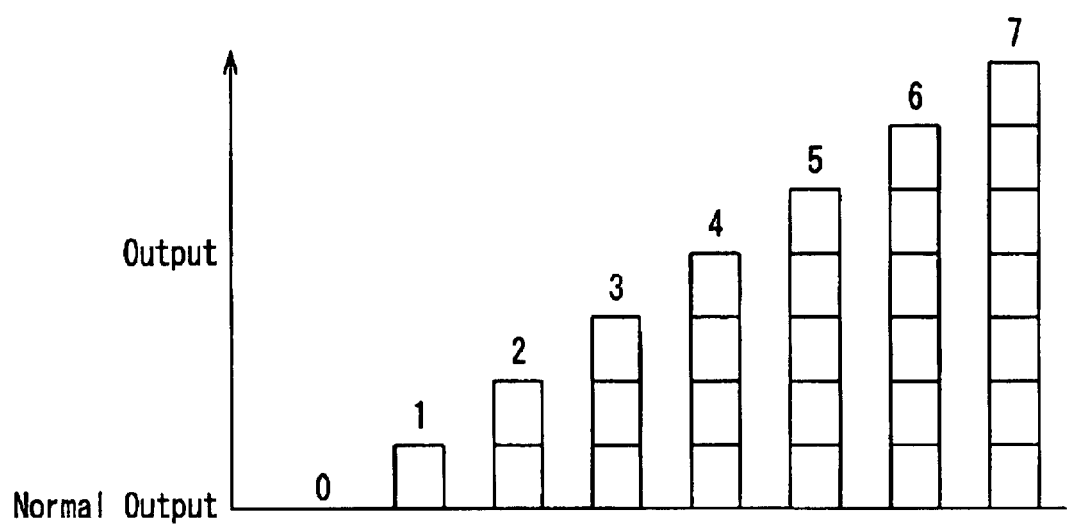
FIG. 6 is a diagram showing the maximum memory value of a magnetic memory of the present invention.

When the output change $\Delta P_3$ of the element 13 is defined as $4\Delta P_1$ instead of $3\Delta P_1$, the magnetic memory can have 8 ($2^3$) memory values (FIG. 6).

Figure 5:
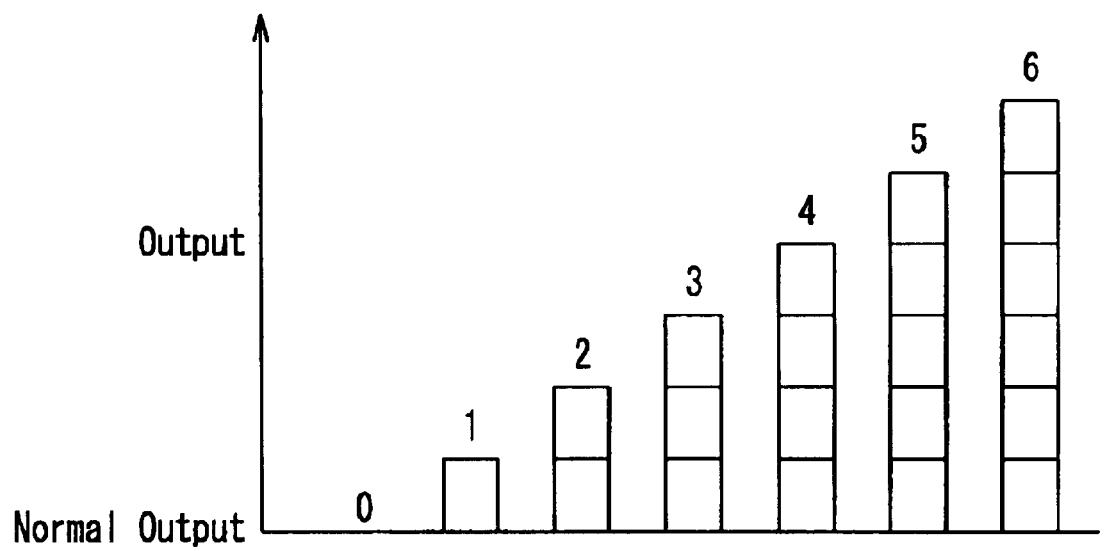
FIG. 5 is a diagram showing the memory values of a magnetic memory of the present invention.
Figure 5:
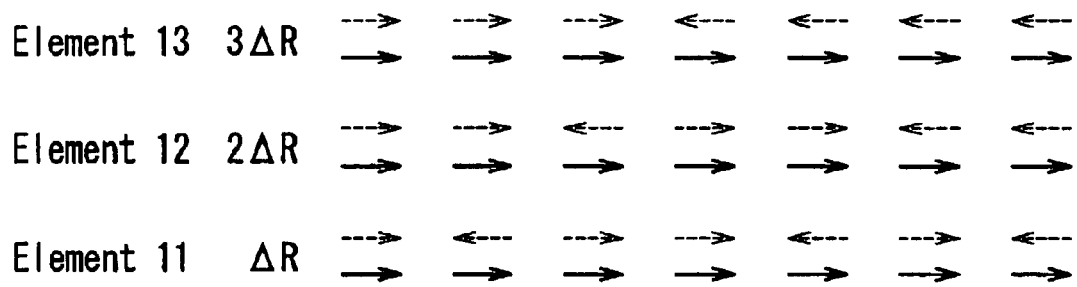

In FIGS. 5 and 6, $\Delta R$ should be not less than a detectable minimum output value. The minimum $\Delta P$ ($I \times \Delta R_{min}$) is preferably not less than 50 mV to allow use of an inexpensive detecting element.

The memory value obtained by N memory layers connected in series is $2^{N-1}$ at the maximum. To achieve this value, it is preferable that the maximum output is not less than $I\Delta R_{min} \times 2^{N-1}$, where $I\Delta R_{min}$ is the minimum output change. Moreover, it is preferable that the (M+1)th smallest output change $I\Delta R_{M+1}$ is not less than $I\Delta R_M \times 2$, where $I\Delta R_M$ is the Mth smallest output change (M is an integer of 1 to (N−1)).

The resistance change $\Delta R$ of each element is the product of the MR ratio and the element resistance R at a measuring bias or measuring current. The resistance change $\Delta R$ can be adjusted easily by controlling the element resistance R, e.g., the thickness of the tunnel insulating layer.

Although the above explanation is directed to the voltage detection, the similar relationships also may be established in current detection.

Figure 7:
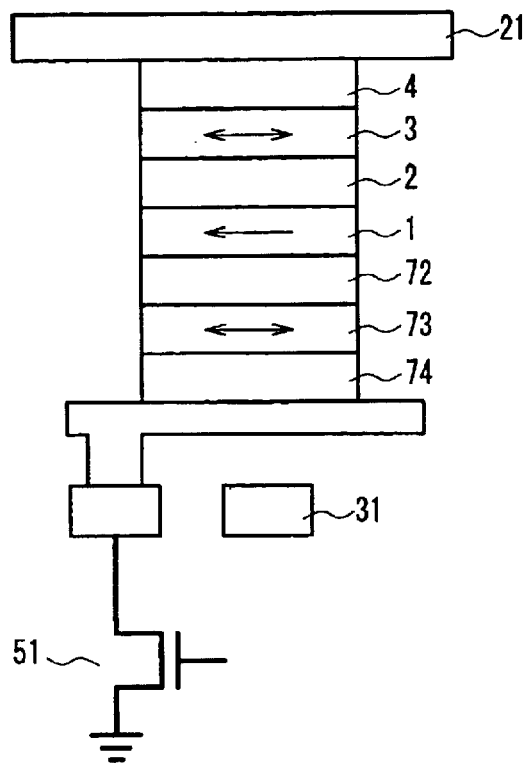
FIG. 7 is a cross-sectional view showing an embodiment of a magnetic memory of the present invention that uses a magnetoresistive element including a plurality of memory layers.

A multivalued memory can be achieved not only by stacking magnetoresistive elements, but also by stacking a plurality of memory layers in a single element (FIG. 7).

As shown in FIG. 7, e.g., a tunnel layer 72, a free layer (memory layer) 73, and a bias tunnel layer 74 are added to the element in FIG. 1B, so that a single element can include two memory layers 3, 73. For this element, the tunnel layers 2, 72, the free layers 3, 73, and the bias tunnel layers 4, 74 are formed in the order mentioned on both sides of the pinned layer 1.

A bit line 21 and a word line 31, which are in the state of perpendicular non-intersecting lines, can be used for the application of a recording magnetic field to the memory layers 3, 73, and a switching element 51 can be used to select this memory. This magnetoresistive element may be stacked as shown in FIGS. 3A and 3B.

When a single element includes a plurality of memory layers, the coercive force (magnetic switching field) of the memory layers can be varied to facilitate writing of information into the individual memory layers. The coercive force may be adjusted by controlling the material, the thickness, and the crystal structure of the memory layer, and further by forming the memory layer as a multilayer film. Alternatively, shape anisotropy may be imparted to the memory layer while taking into account the direction of the application of an external magnetic field.

Even if the memory layers 3, 73 in a single magnetoresistive element have substantially the same coercive force, information can be written into the individual memory layers by utilizing a difference in positions of the memory layers with respect to the bit line 21 and the word line 31. This is because the amount of current required for magnetization reversal varies with a distance between the memory layer and each of the recording conductors. A specific example of this operation will be described later by referring to FIG. 15.

Three or more memory layers may be included in a single element. However, the thickness of a laminate 1–4, 72–74 (including the pinned layer, the free layers, and the tunnel layers) is preferably not more than 500 nm so that a distance between the memory layer and each of the recording conductors is not excessively large.

Figure 8:
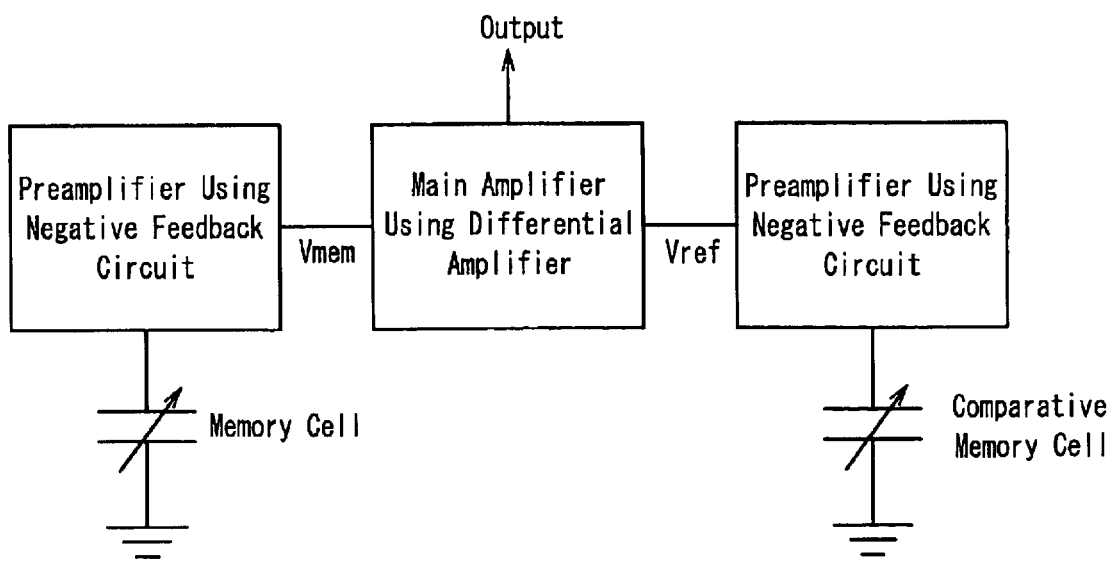
FIG. 8 is a circuit diagram showing an example of how the output is taken from a magnetic memory of the present invention.

It is preferable that a circuit for detecting the output of a magnetic memory is connected to a comparative memory via a differential amplifier (FIG. 8). A difference in output between the magnetic memory and the comparative memory can be used to cancel the wiring resistance and the resistance of a reference element. This detecting circuit makes it easier to improve a S/N ratio.

Figure 9A:
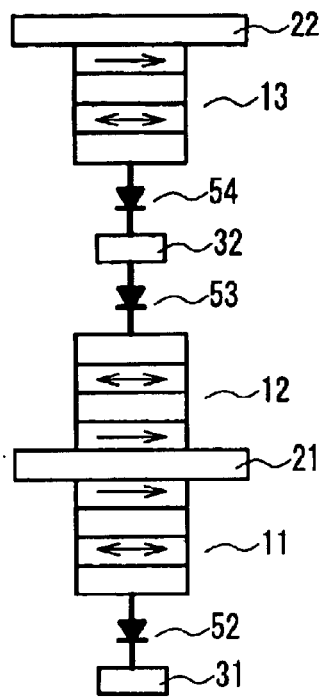
FIGS. 9A and 9B are cross-sectional views, each showing yet another embodiment of a magnetic memory of the present invention.
Figure 9B:
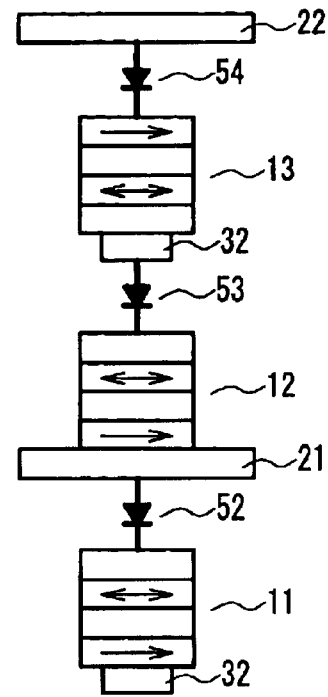

The same memory can be produced using rectifier elements 52, 53, 54, which are typified by a diode and a tunnel diode, instead of the switching element 51 (FIGS. 9A and 9B).

For this memory, the rectifier elements 52, 53, 54 are placed respectively between the recording conductors. Therefore, the resistance changes of magnetoresistive elements 11, 12, 13 can be read out individually. This memory uses word lines 31, 32 as well as bit lines 21, 22 (sense lines) for reading information. A resistance change between the word line 31 and the bit line 21 is read as a voltage/current change for the element 11, a resistance change between the bit line 21 and the word line 32 for the element 12, and a resistance change between the word line 32 and the bit line 22 for the element 13. This embodiment can improve a S/N ratio easily because the elements are separated electrically from one another.

Figure 10:
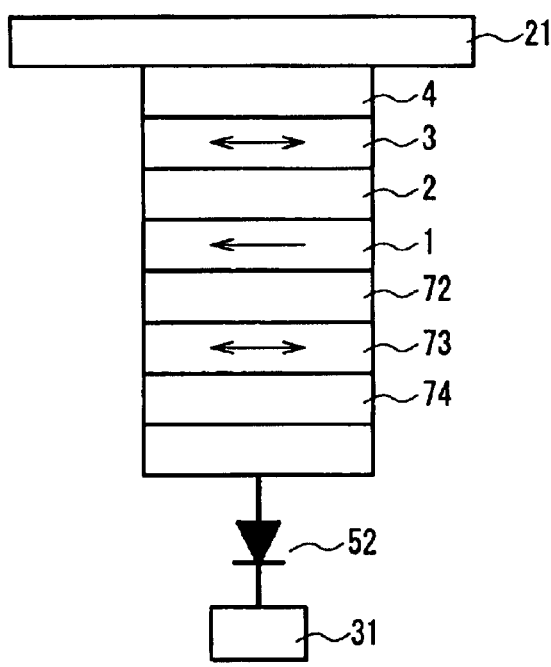
FIG. 10 is a cross-sectional view showing another embodiment of a magnetic memory of the present invention that uses a magnetoresistive element including a plurality of memory layers.

The element shown in FIG. 4 also may use a rectifier element 52 instead of the switching element 51 (FIG. 10).

A magnetic memory of the present invention is not limited to the above configurations. For example, further elements or memory layers may be stacked, and wiring may be changed appropriately.

The following is an explanation of the arrangement of magnetic memories in the in-plane direction.

Figure 11:
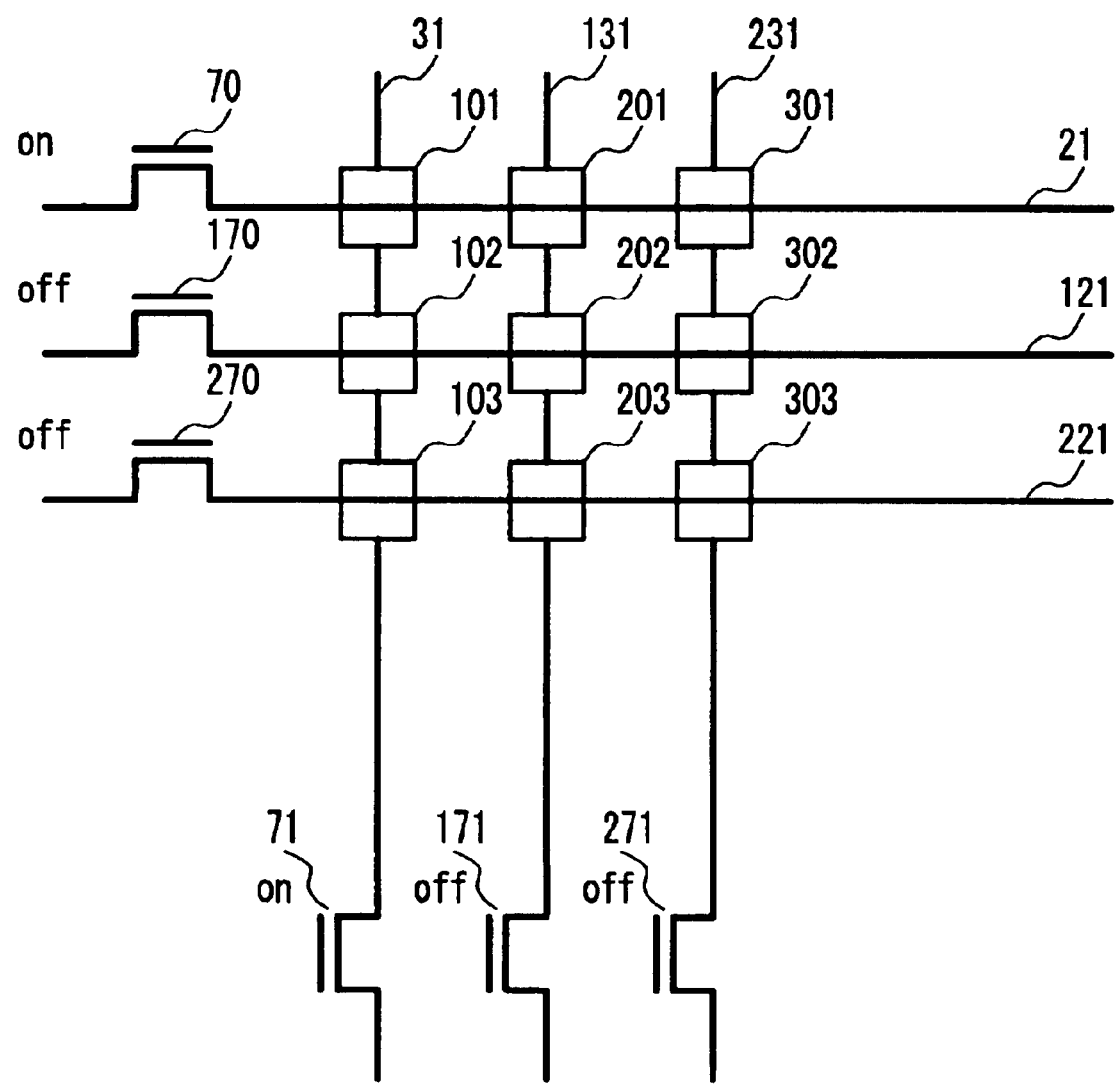
FIG. 11 is a plan view showing an embodiment of a magnetic memory device including a plurality of magnetic memories of the present invention that are arranged in the in-plane direction.

The magnetic memories may be arranged in matrix form with a predetermined number of memory columns and memory rows (FIG. 11). The magnetic memories 101, 102, ..., 201, 202, ..., 301, ..., 303, ... are located at the intersections of word lines 31, 131, 231, ... and bit lines 21, 121, 221, ..... A recording current supplied to the recording conductors is controlled by switching elements 70, 170, 270, ..., 71, 171, 271, ... that are provided for each of the recording conductors. This control is performed by so-called coincident-current selection. For the example shown in FIG. 11, only the switching elements 70, 71 are in the on state to select the magnetic memory 101 located at the intersection of the word line 31 and the bit line 21, so that a recording magnetic field is applied to this memory.

Figure 12:
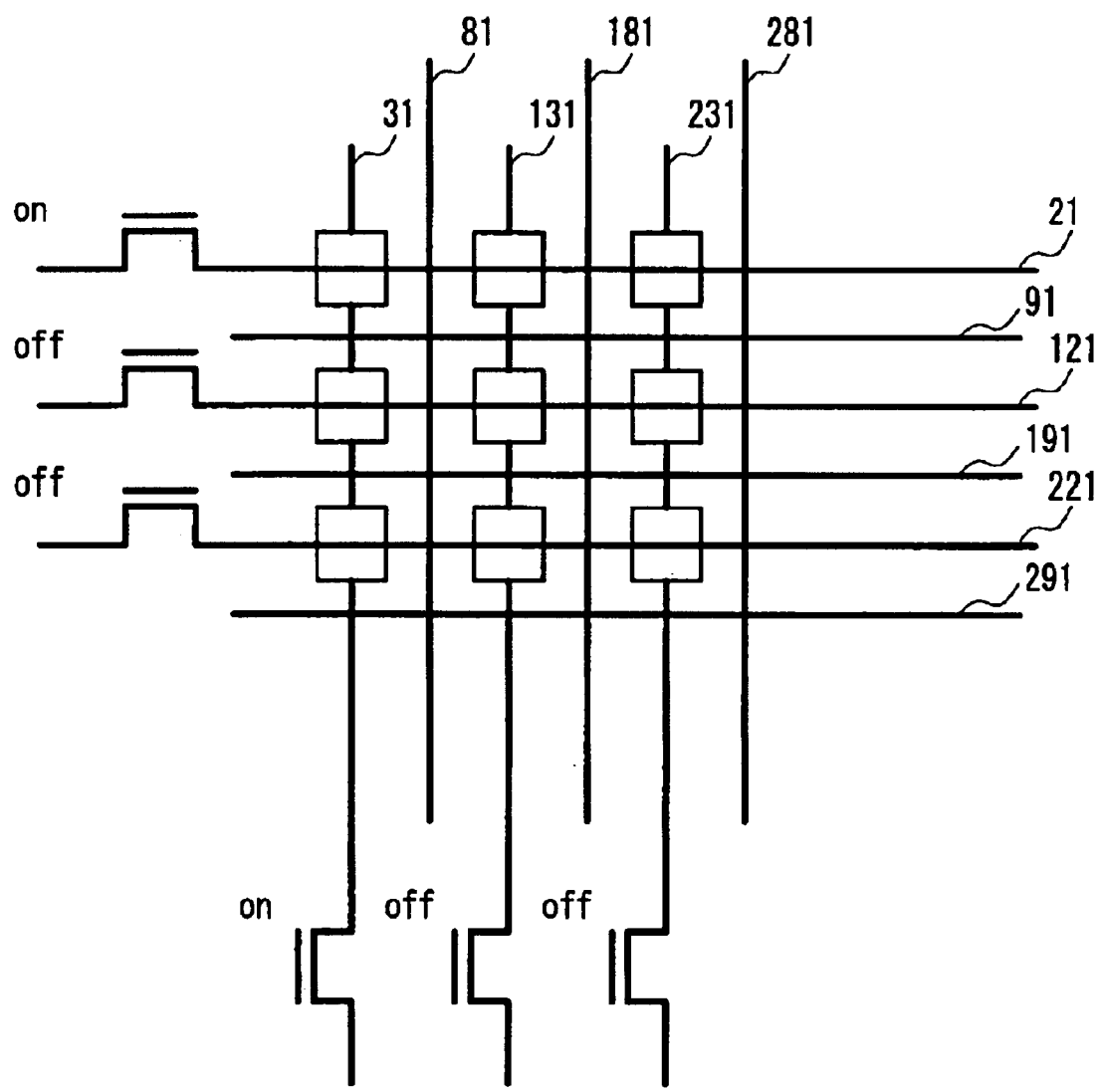
FIG. 12 is a plan view showing another embodiment of a magnetic memory device of the present invention.

When the addressing speed of the switching elements is increased, or the space between the recording conductors is reduced, an inductive coupling current or capacitive coupling current may be generated between the recording conductors, resulting in magnetic crosstalk. To suppress the magnetic crosstalk, it is preferable that bonding wires 81, 181, 281, ..., 91, 191, 291, ... are arranged between the recording conductors (FIG. 12).

Figure 13:
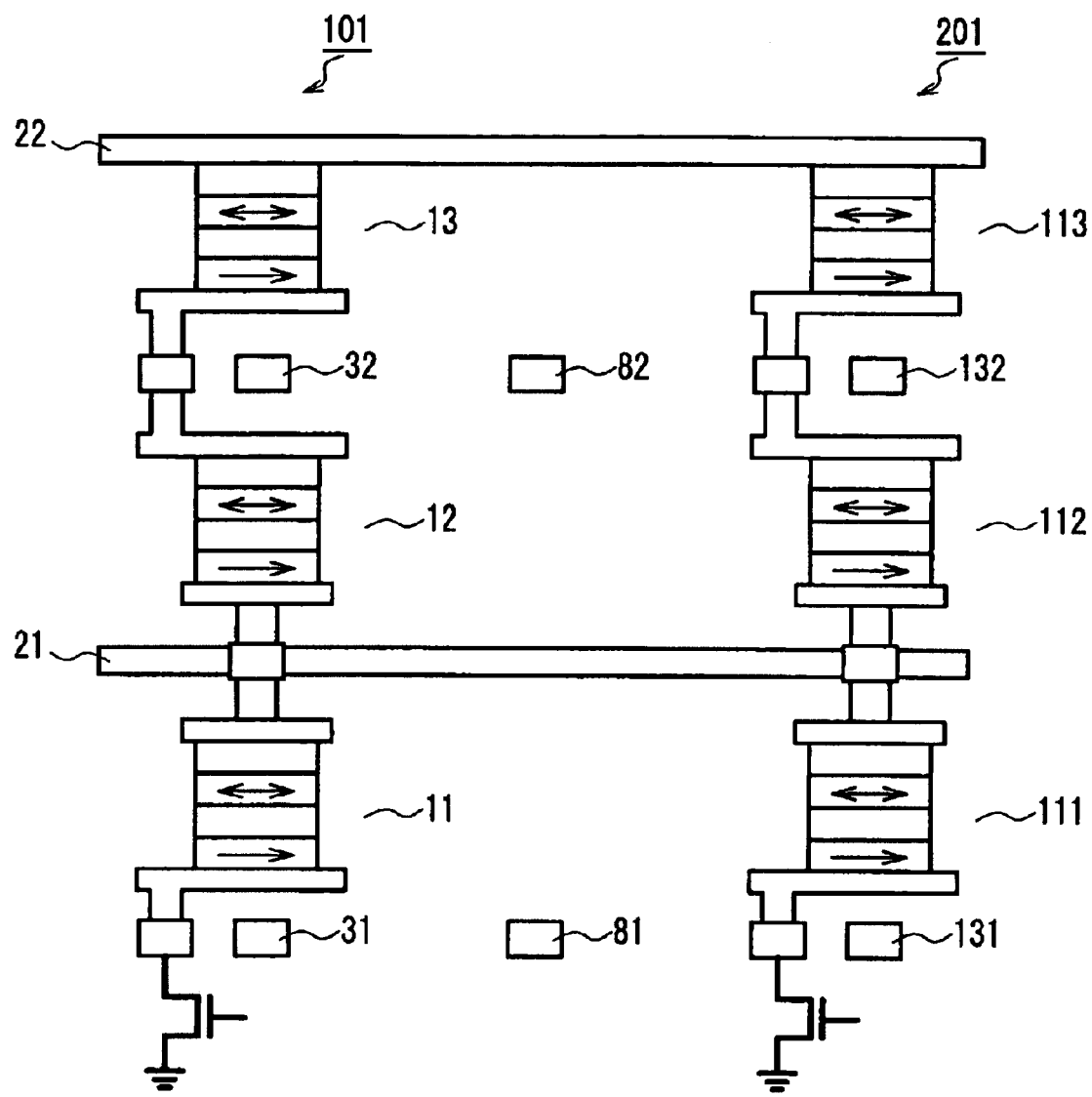
FIG. 13 is a cross-sectional view showing the positional relationship of conductors in the magnetic memory device in FIG. 12.

The bonding wires may be arranged between each of the recording conductors that lie in the thickness direction of the layers (FIG. 13). For example, bonding wires 81, 82 are placed between magnetic memories 101, 201, which are adjacent in the direction of bit lines 21, 22, so that the bonding wire 81 is arranged between word lines 31, 131 and the bonding wire 82 is arranged between word lines 32, 132. The bonding wires 81, 82 can suppress the occurrence of recording errors in a pair of adjacent magnetoresistive elements 11, 111 (12, 112; 13, 113). The bonding wires may be maintained at a predetermined constant potential, e.g., a ground potential.

As described above, uniaxial anisotropy may be imparted to a free layer (memory layer) for recording information. A switching magnetization curve of the free layer with uniaxial anisotropy may not be an ideal curve having fourth order symmetry (FIG. 14A), but can be an asteroid curve (FIG. 14B), which is obtained by enlarging the ideal curve in the direction of a hard axis of magnetization. This tendency becomes conspicuous in a memory layer whose anisotropy in the direction perpendicular to the film surface is not uniform, i.e., a memory layer including at least two magnetic films, such as a two-layer film including a soft magnetic film and a film with a high coercive force. When a memory layer is a laminate including a pair of magnetic films that are coupled magnetostatically via a non-magnetic film, the switching magnetization curve may have a multi-axially stable shape.

Figure 14A:
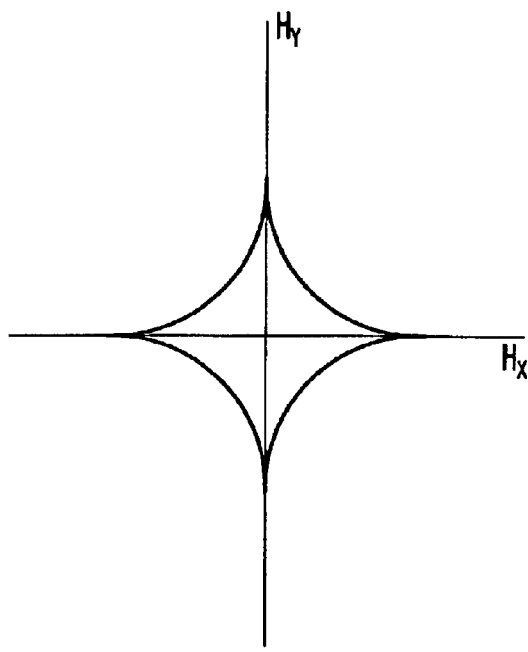
FIGS. 14A and 14B each show an example of a magnetic switching curve of a memory layer.

When the easy axes of magnetization of two memory layers having the magnetic switching curve as shown in FIG. 14A are rotated by a predetermined angle a with respect to each other, a magnetization reversal region lies within one switching curve and out of the other switching curve (FIG. 17A). The application of a magnetic field indicated by a point A in FIG. 17A reverses only the magnetization of the memory layer having a switching curve a, while the application of a magnetic field indicated by a point B reverses only the magnetization of the memory layer having a switching curve b.

This behavior can be used to record information on a desired memory layer while suppressing magnetic crosstalk. When the easy axes of the memory layers depend on shape anisotropy, the angle a between the easy axes can be expressed by an angle between the longitudinal directions of memory layers 3a, 3b (FIG. 17B). In this case, the angle a preferably ranges from 20° to 70°. For convenience, the surface shape of the elements is illustrated as rectangular. However, the elements may have other surface shapes (FIGS. 19B to 19E).

Figure 14B:
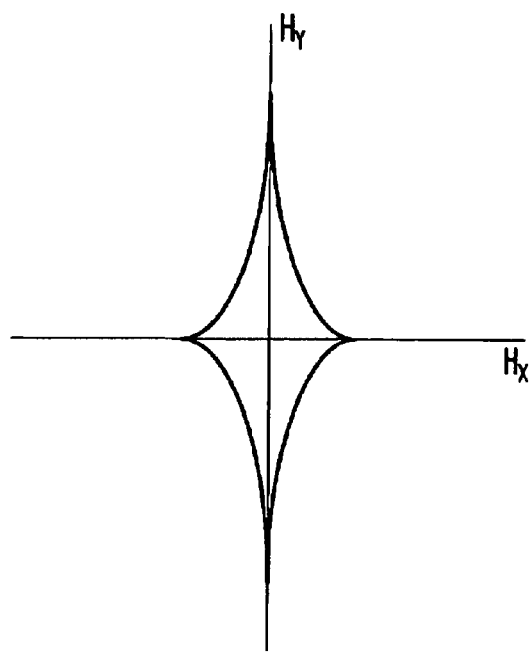
Figure 15:
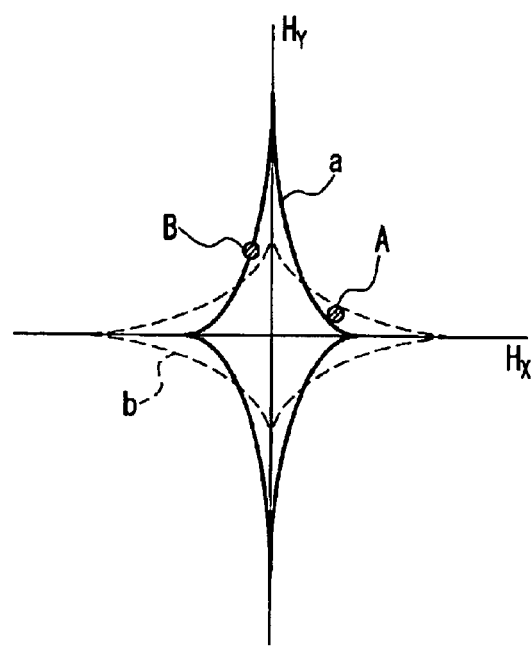
FIG. 15 shows the relationship between a magnetic switching curve of a memory layer and a synthetic magnetic field for magnetization reversal.

Similarly, when the easy axes of magnetization of two memory layers having the magnetic switching curve as shown in FIG. 14B are rotated with respect to each other, a region of a magnetic field that reverses only the magnetization of one memory layer also can be provided (FIG. 15). In this case, the angle between the easy axes preferably ranges from 20° to 90°.

Thus, a memory device that includes magnetic memories in matrix form can suppress magnetic crosstalk by rotating the easy axes of magnetization of adjacent memory layers in different directions with respect to each other, i.e., by maintaining an angle between the easy axes preferably in the range of 20° to 90°, and more preferably in the range of 20° to 7° (FIG. 18). For an MRAM shown in FIG. 18, memory layers 201, 202, 203, ..., 211, 212, 213, ..., 221, 222, 223, ... are arranged so that the angle between the easy axes of magnetization of the memory layers that are adjacent in the in-plane direction of the layers ranges from 20° to 70°.

Figure 16:
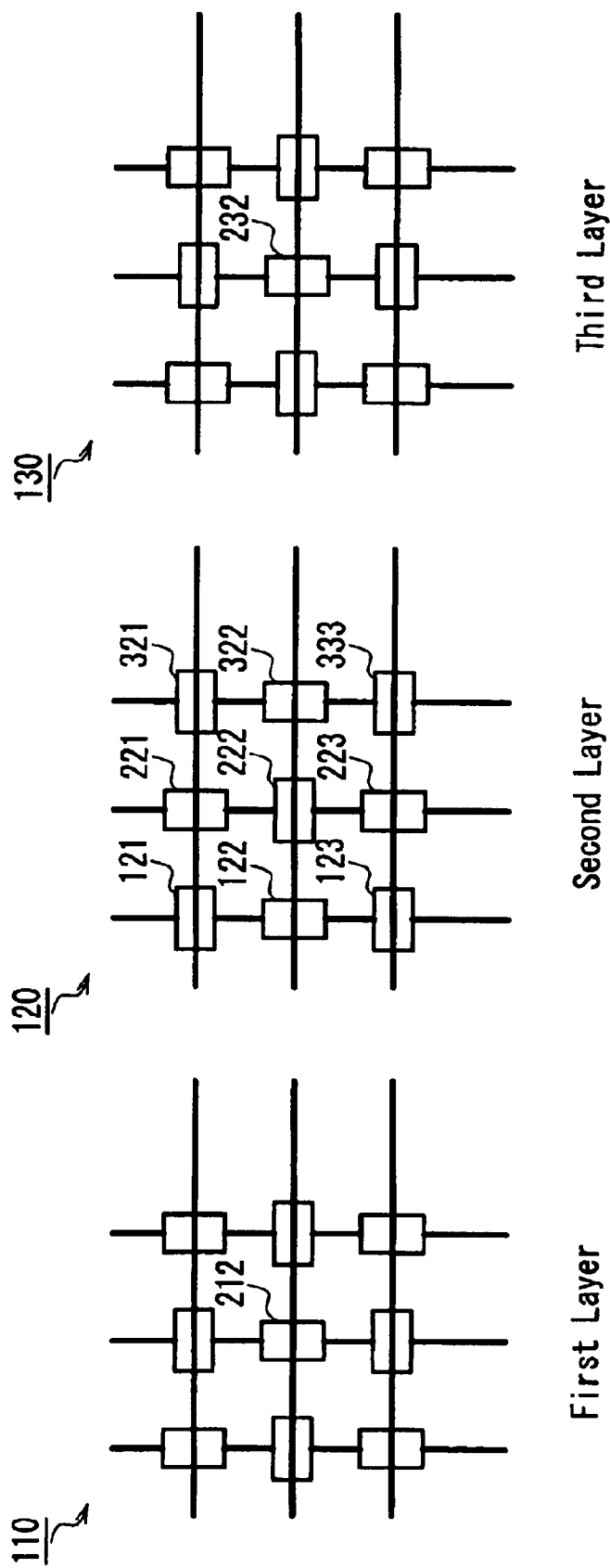
FIG. 16 is a plan view showing the relative relationship between easy axes of magnetization of the memory layers in a magnetic memory device of the present invention.

The memory layers also may be arranged in such a manner that the easy axes of magnetization of the memory layers that are adjacent in the direction perpendicular to the plane of the layers (the thickness direction of the layers) are rotated with respect to each other (FIG. 16). For a memory device shown in FIG. 16, a second memory layer plane 120, where memory layers are arranged in matrix form, is placed between a first memory layer plane 110 and a third memory layer plane 130. Each of the memory layers 121, 122, 123, ..., 221, 222, 223, ..., 321, 322, 323 ... in the second memory layer plane 120 has the easy axis of magnetization that differs from those of the adjacent memory layers located not only in the in-plane direction, but also in the direction perpendicular to that memory layer. With this arrangement, the memory layer 222 and the adjacent memory layers (in both vertical and horizontal directions) 122, 221, 223, 322, 212, 232 are different from each other in direction of the easy axis of magnetization.

Assuming that the memory layers have the magnetic switching curve as shown in FIG. 14B, the angle a between the easy axes is set to 90° in FIG. 16.

Figure 19A:
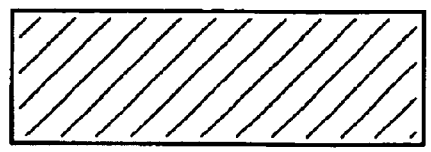
FIGS. 19A to 19E are plan views, each showing an example of the surface shape of a memory layer.
Figure 19B:
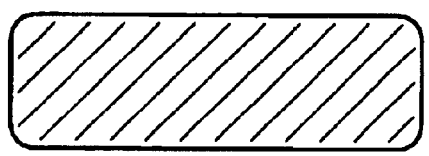
Figure 19C:
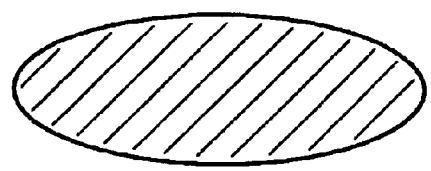
Figure 19D:
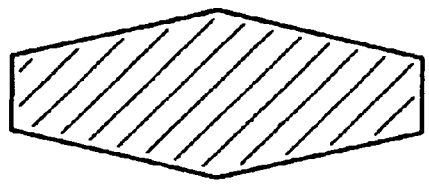
Figure 19E:
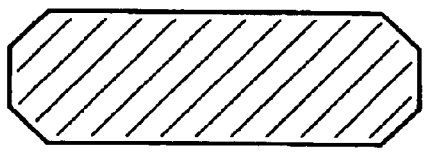

In FIGS. 16 and 18, the surface shape of the memory layer is illustrated as rectangular (FIG. 19A). However, the memory layer can have other surface shapes (FIGS. 19B to 19E). The square shape of a memory or the reliability of information storage can be improved by forming the memory layer in shapes such as a polygon with rounded corners (FIG. 19B), an ellipse (FIG. 19C), and a polygon having interior angles of more than 90° (FIGS. 19D, 19E).

In general, the switching element is turned off during magnetization reversal of the memory layer. The switching element is turned on when a sense current flows through the memory layer so as to read an output change in accordance with the magnetic state of the memory layer.

Figure 20A:
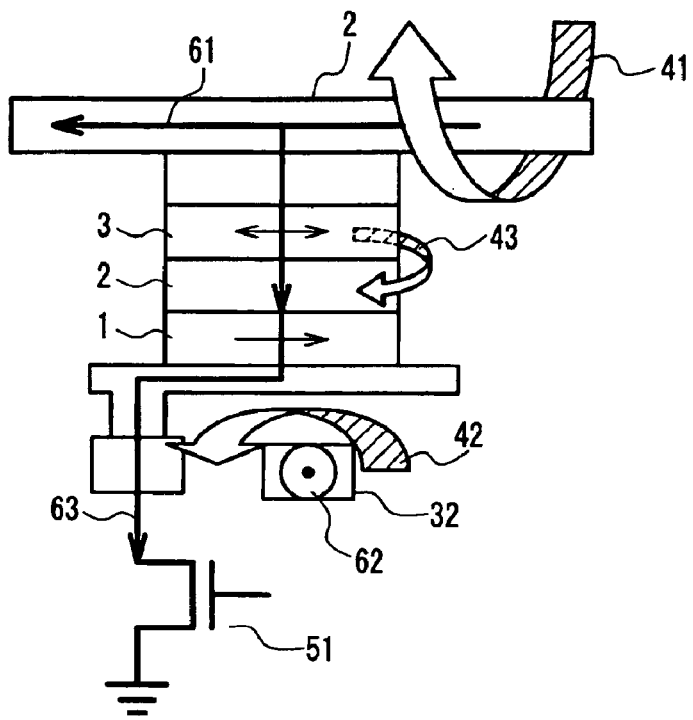
FIGS. 20A to 20C show an example of a driving method of the present invention.

A current flowing through the memory layer in its thickness direction can be used to determine the direction of rotation of the magnetization of the memory layer (FIG. 20A). In FIG. 20A, a switching element 51 is turned on, then a current 63 flows through the element in the thickness direction of the layers, and a magnetic field 43 is produced and surrounds a memory layer (free layer) 3 in the in-plane direction, thereby reversing the magnetization of the memory layer 3. The magnetic field 43 contributes to smoother rotation of magnetization of the memory layer. Magnetic fields 41, 42 also may be produced by currents 61, 62 flowing through a bit line 21 and a word line 32 in the in-plane direction of the layers, respectively.

Figure 20B:
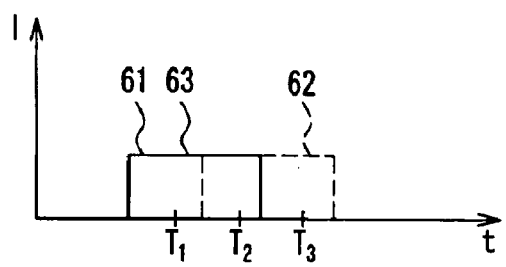

It is preferable that the application of the current 62 through the word line 32 is started (ended) after the application of the current 63 through the switching element 51 is started (ended) (FIG. 20B). This is because the magnetic field 43 produced by the current 63 induces rotation of the magnetization, and the magnetic field 42 produced by the current 62 directs the rotating magnetization to a predetermined direction. In this magnetoresistive element, a current is separated from the bit line 21 (the sense line) and supplied to the switching element 51, so that the currents 61, 63 flow simultaneously.

Figure 20C:
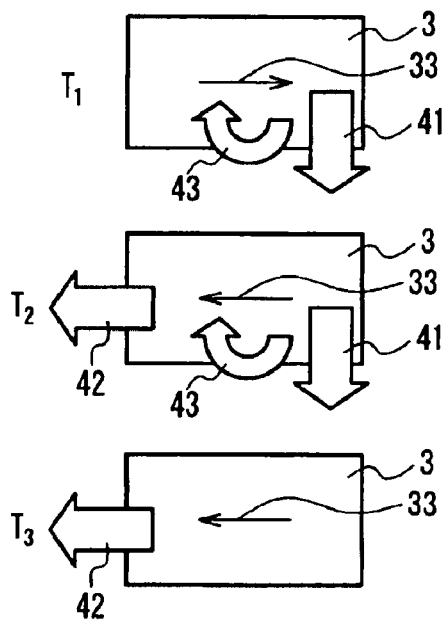

At time $T_1$ in FIG. 20B, the magnetic fields 41, 43 are applied so as to cross over the magnetization direction 33 of the memory layer 3 (i.e., in the short side direction of the layer), making the magnetization direction 33 unstable (FIG. 20C). When only the magnetic field 41 is applied, the fluctuation of magnetization that serves as a starting point for magnetization reversal occurs at both ends of the layer. However, the simultaneous application of the magnetic fields 41, 43 allows the fluctuation of magnetization to occur more easily at one end of the layer. In this case, the magnetization of the memory layer is rotated in a clockwise direction when viewed along the flow of the current 63, i.e., when viewed from the top of the element in FIG. 20A. Thus, the magnetization starts to rotate.

At time $T_2$, the magnetic field 42 is applied in the opposite direction (antiparallel) to the original magnetization direction. At time $T_3$, the application of the magnetic fields 41, 42 is ended, so that the magnetization direction 33 is determined (FIG. 20C).

In FIG. 20A, to return the reversed magnetization to its original state, the current 62 should flow through the word line 32 in the reverse direction. When the magnetization of the memory layer is rotated in a counterclockwise direction, the currents 61, 63 should flow in the reverse direction.

This element also can use the current 63 to read information from the memory layer 3.

Figure 21A:
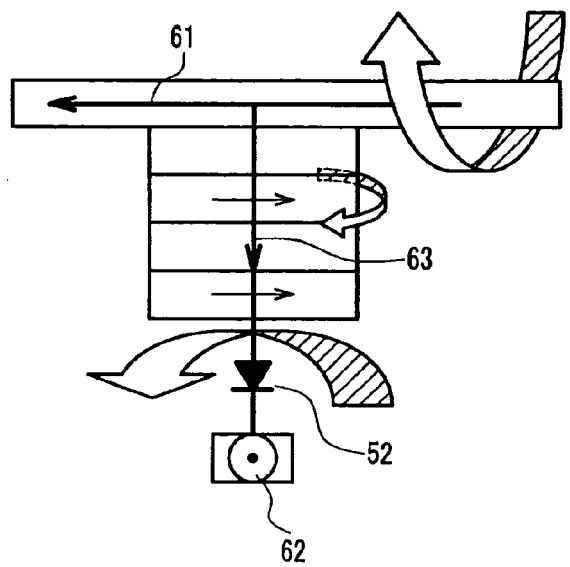
FIGS. 21A and 21B are cross-sectional views of a magnetic memory, showing another example of a driving method of the present invention.
Figure 21B:
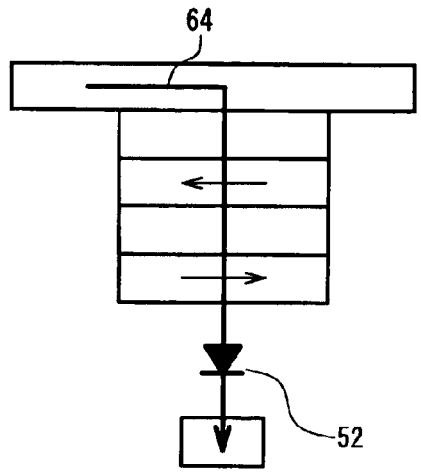
Figure 22A:
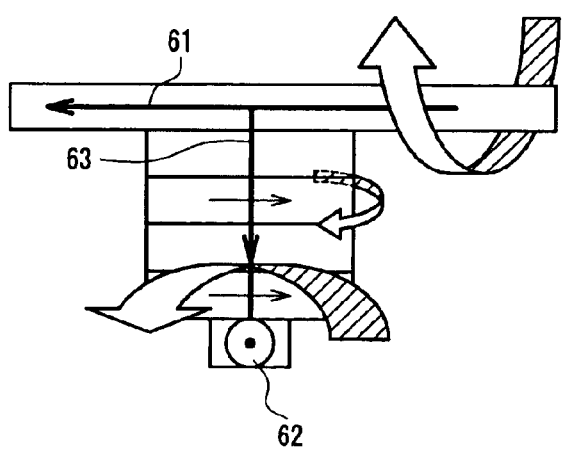
FIGS. 22A and 22B are cross-sectional views of a magnetic memory, showing yet another example of a driving method of the present invention.
Figure 22B:
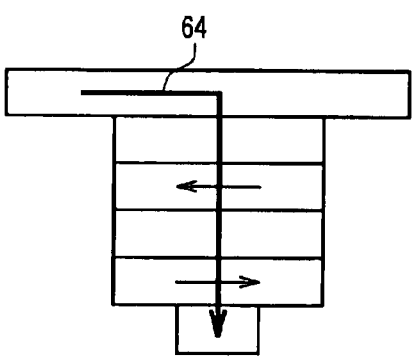

The writing/reading operation is the same either when a rectifier element 52 is used instead of the switching element 51 (FIGS. 21A, 21B) or when these elements are not used (FIG. 22A, 22B). FIGS. 21B and 22B show the reading operation with a sense current 64.

As described above, a driving method of the present invention can be applied to both a conventional TMR element including a single memory layer and a magnetic memory including two or more memory layers that are stacked in the thickness direction of the layers. For this magnetic memory, the memory layers have a higher density, and thus it may be difficult for a conventional driving method to smoothly reverse the magnetization of a certain memory layer. Therefore, the above driving method can provide a significant advantage.

Figure 23:
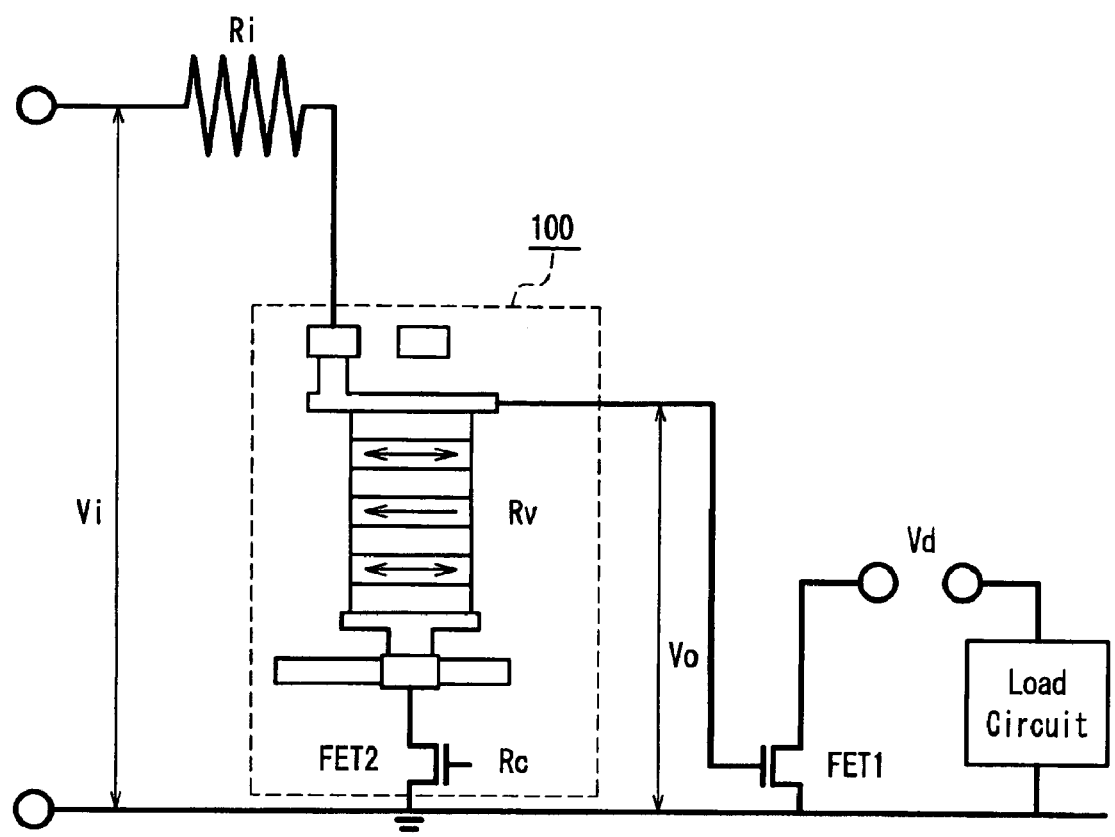
FIG. 23 is a circuit diagram showing an example of a system LSI using a magnetic memory of the present invention.

Any magnetic memories as described above can be used to produce a programmable or reconfigurable memory with memory function. FIG. 23 shows an example of the basic circuit of the programmable or reconfigurable memory. Although this example employs the memory 100 shown in FIG. 7, available magnetic memories are not limited thereto.

In FIG. 23, the relationship expressed by $Vo=Vi\times(Rv+Rc)/(Ri+Rv+Rc)$ is established, where Rc is the on resistance of FET2, and Rv is the resistance of a laminate including a total of four tunnel layers. When the magnetization direction of a predetermined memory layer is parallel to that of a pinned layer, Rv is represented by Rvp. When they are antiparallel, Rv is represented by Rvap. A resistance in antiparallel magnetizations is relatively higher than a resistance in parallel magnetizations. Under these conditions, if the relationship between a gate voltage Vd for a load circuit and the resistance of the magnetoresistive element is given by $Vd<Vo=Vi\times(Rvap+Rc)/(Ri+Rvap+Rc)$ $Vd>Vo=Vi\times(Rvp+Rc)/(Ri+Rvp+Rc),$ then the memory can be used as a nonvolatile reconfigurable memory.

This circuit can be a nonvolatile programmable element by using a logic circuit as the load circuit, and can store, e.g., static images in a nonvolatile manner by using a display circuit as the load circuit. This circuit also can be used as a system LSI having these functions. Each of the FETs in FIG. 23 may be formed on a wafer.

As described in the following examples, it is preferable that the magnetic memory is packaged in a magnetic shield. It is also preferable that a memory device (e.g., MRAM) and a system LSI are provided with a magnetic shield. The magnetic shield can suppress malfunction due to external magnetic noise. The magnetic shield may be made simply of a general magnetic material.

EXAMPLES

Example 1

An integrated memory was produced on a CMOS substrate with magnetic memories, each magnetic memory including a three-level magnetoresistive element as shown in FIG. 3. The integrated memory was sealed in a ceramic package, and the entire package was plated with a 100 µm thick NiFe film as a magnetic shield.

Figure 24:
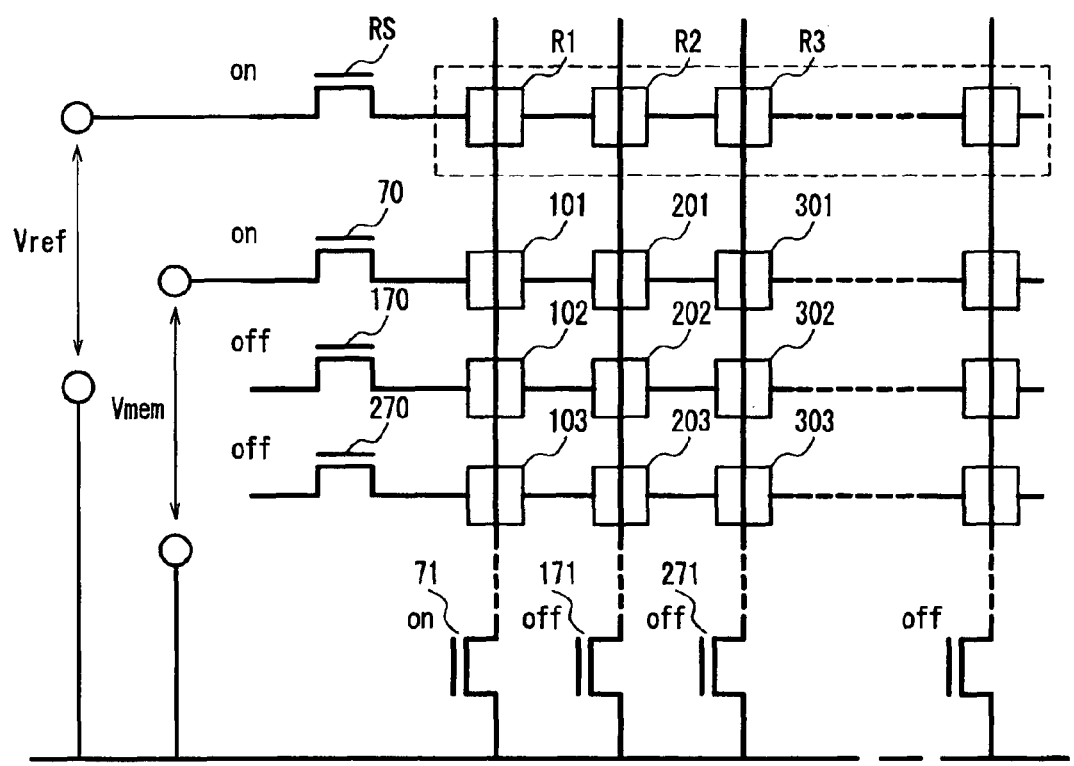
FIG. 24 is a plan view showing another example of a magnetic memory device including magnetic memories of the present invention that are arranged in the in-plane direction.

The magnetic memories were arranged in matrix form as shown in FIG. 11, and comparative magnetic memories R1, R2, R3, . . . were located for each memory column (FIG. 24). The comparative magnetic memories also included a three-level magnetoresistive element. The integrated memory included 256×256 magnetic memories (the total number of magnetoresistive elements was 256×256×3) and 256 comparative magnetic memories.

A first magnetoresistive element of each of the magnetic memories was produced with the following layered structure:

Lower electrode/Ta(3)/PtMn(20)/CoFe(3)/Ru(0.9)/CoFe (3)/AlO(1.0)/NiFe(2)/AlO(1.0)/CoFe (3)/Ru(0.9)/CoFe(3)/ PtMn(20)/Ta(3)/upper electrode.

The figure in parentheses represents the thickness of each layer in nm, and the AlO thickness indicates the thickness of Al before oxidation (the thickness is expressed in the same manner in the following).

In this element, AlO was a tunnel layer, NiFe was a memory layer, and PtMn was an antiferromagnetic layer with which the magnetization of a pinned layer (CoFe/Ru/ CoFe) was relatively hard to rotate.

A second magnetoresistive element was produced in the same manner as the first element except that two layers of AlO(1.0) were replaced by AlO(1.06).

A third magnetoresistive element was produced in the same manner as the first element except that two layers of AlO(1.0) were replaced by AlO(1.12).

After deposition, these elements were heat-treated in a magnetic field of 5 kOe at 280° C. for 1 hour so as to impart unidirectional anisotropy to PtMn. Then, the surface shape of each layer in the individual elements was processed so that the long side direction was parallel to the direction of the unidirectional anisotropy. Specifically, the surface shape was 0.2 µm×0.3 µm, and the long side direction of each layer was aligned in the horizontal direction of FIG. 3A.

The outputs of the individual magnetoresistive elements other than wiring resistance and CMOS resistance were 40 mV for the first level, 80 mV for the second level, and 160 mV for the third level.

A synthetic magnetic field produced by word lines and bit lines was used to record three bits for each magnetic memory including the three-level magnetoresistive element. Referring to FIGS. 3 and 24, first, the switching elements 70, 71 for the magnetic memory 101, into which information was to be written, were addressed. Then, a current flowed through the bit line 21 that extended between the elements 11, 12. The magnetizations of the elements 11, 12 were reversed simultaneously by allowing a current to flow through the word lines 31, 32 at the same time while applying a magnetic field to the elements in their short side direction. The simultaneous magnetization reversal of two or more elements was performed to reduce power consumption.

Subsequently, a current flowed through the bit line 22, a magnetic field was applied to the element 13 in its short side direction, and a current flowed through the word line 32, thus reversing the magnetization of the element 13.

The length of time that a current flows through the bit lines and the word lines (i.e., the pulse duration of a current) was 25 nsec (nanosecond) and controlled so that a current pulse from the word line arrived at the element 10 nsec after the arrival of a current pulse from the bit line.

Next, the reading operation will be described. First, the switching elements 70, 71, RS for the magnetic memory 101 and the corresponding comparative magnetic memory R1 were addressed. Then, a sense current flowed through the magnetic memory 101 and the comparative magnetic memory R1.

The outputs Vmem and Vref from the respective memories 101, R1 were amplified by the circuit as shown in FIG. 8 to decide which one of the eight memory values the resultant output value agreed with.

In the circuit of FIG. 24, a sense current is split into the magnetic memory to be read and the comparative magnetic memory, and thus an additional switching element is necessary. However, separate circuits can be used for the magnetic memories and the comparative magnetic memories so as to reduce bias variations and lower the minimum value of a read voltage.

Moreover, information was written simultaneously into the magnetoresistive elements in the same level of different magnetic memories. In this case, the memory 101 and every other memories 301, . . . , 103, . . . , 303, . . . arranged in the row or column direction were selected. When information is written simultaneously into the elements that are not adjacent to each other in either row or column direction, writing can be performed efficiently while suppressing magnetic crosstalk, so that power consumption can be reduced. In this case, a capacitor portion (not shown) may be located in parallel with each wiring and charged/discharged to lighten the load of power supply.

When simultaneous writing of information into a plurality of memories is combined with reading of information while suppressing current splitting, a writing signal may differ from a reading signal with respect to a time base. In this case, a shift resistor or buffer memory can be used as a circuit that controls input/output signals.

Example 2

An integrated memory was produced on a CMOS substrate with magnetic memories arranged in matrix form, each magnetic memory including a magnetoresistive element having two memory layers 3, 73 as shown in FIG. 7. The integrated memory was provided with a magnetic shield similar to that of Example 1. Among the layers illustrated in FIG. 7, the magnetoresistive element did not include the bias tunnel layers 4, 74.

The magnetic memories were arranged in the same manner as Example 1 (FIG. 24). The total number of memories in this integrated memory was 256×256×2. By using the integrated memory as a frame, an MRAM of 8 frames was produced.

The magnetoresistive element had the following film configuration:

Lower electrode/Ta(3)/NiFeCr(4)/NiFe(2)/AlO(1.0)/CoFe(3)/Ru(0.8)/CoFe(3)/PtMn(20)/CoFe (3)/Ru(0.8)/CoFe(3)/AlO(1.06)/NiFe(2)/NiFeCr(4)/Ta(3)/upper/electrode.

In this element, AlO was a tunnel layer, and NiFe was a memory layer.

As with Example 1, the multilayer film was heat-treated and then processed in view of unidirectional anisotropy, so that the long side direction of each layer was aligned in the horizontal direction of FIG. 7.

A MR ratio was measured by applying a uniform magnetic field to the element with an external coil. The results showed that the coercive force of the two memory layers (NiFe) was about the same. The output changes of the individual memory layers caused by magnetization reversal other than wiring resistance and CMOS resistance were about 40 mV for the memory layer 73 on the lower electrode side and about 80 mV for the memory layer 3 on the upper electrode side.

These output changes were values obtained by a MR curve of the following multilayer film. This multilayer film was formed so as to include NiFe(6) and NiFe(2) that differed in magnitude of shape anisotropy.

Lower electrode/Ta(3)/NiFe(6)/AlO(1.0)/CoFe(3)/Ru (0.8)/CoFe(3)/PtMn(20)/CoFe(3)/Ru (0.8)/CoFe(3)/AlO (1.06)/NiFe(2)/NiFeCr(4)/Ta(3)/upper electrode.

Figure 25:
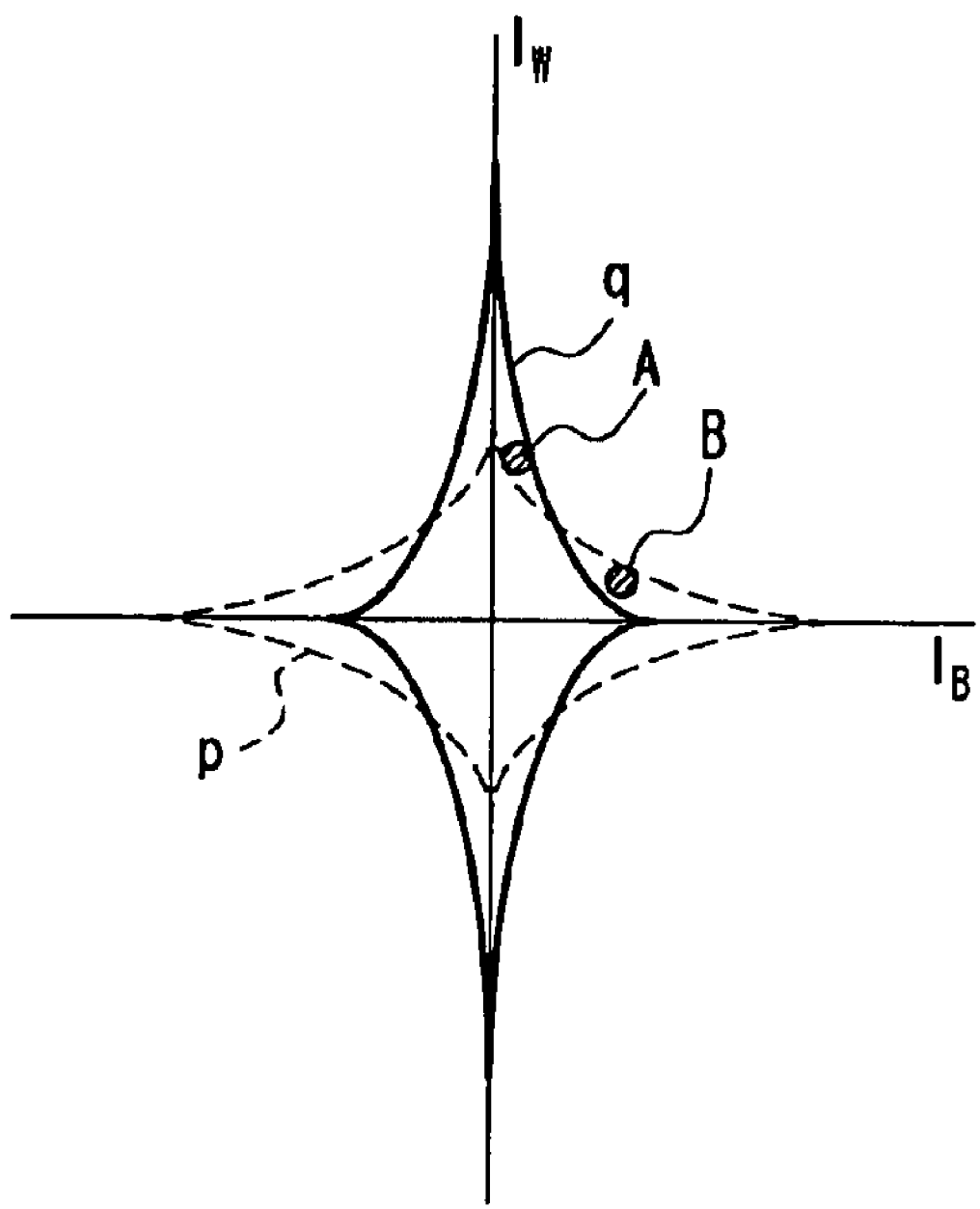
FIG. 25 is a magnetic switching curve that shows magnetization reversal by a current $I_W$ flowing through word lines and a current $I_B$ flowing through bit lines.

A synthetic magnetic field produced by a word line and a bit line was used to write information individually into the memory layers 3, 73. Both magnetic switching curves of the memory layers have substantially the same shape as shown in FIG. 14A. However, depending on a difference in relative distance between each of the memory layers 3, 73 and the bit line 21 or the word line 31, a current-based magnetic switching curve is enlarged in the direction of the recording conductor that is located relatively close to the memory layers (FIG. 25). Therefore, the application of a synthetic current indicated by a point A reverses only the magnetization of the memory layer 3 having a magnetic switching curve p, while the application of a synthetic current indicated by a point B reverses only the magnetization of the memory layer 73 having a magnetic switching current q.

This behavior can be used to write information into any memory layer selected from a plurality of memory layers in a single magnetoresistive element.

The writing and reading operations can be performed in the same manner as Example 1. This MRAM allows information to be read simultaneously from one element for each of the 8 basic frames, so that memories with a total of 2×8 bits can be read at the same time.

Example 3

An integrated memory was produced on a glass substrate with magnetic memories, each magnetic memory including a three-level magnetoresistive element as shown in FIG. 9. The integrated memory was provided with a magnetic shield similar to that of Example 1.

The magnetic memories were arranged as shown in FIG. 24. The integrated memory included 256×256 magnetic memories (the total number of magnetoresistive elements was 256×256×3). By using this group of magnetic memories as a frame, an MRAM of 8 frames was produced.

All of first, second, and third magnetoresistive elements had the following film configuration:

Lower electrode/Ta(3)/PtMn(20)/CoFe(3)/Ru(0.9)/CoFe(3)/AlO(1.0)/Fe(2)/AlO(1.3)/Ta(3)/upper electrode.

In these elements, AlO was a tunnel layer, Fe was a memory layer, and AlO in contact with Ta was a bias tunnel layer.

As with Example 1, the multilayer film was heat-treated and then processed in view of unidirectional anisotropy, so that the long side direction of each layer was aligned in the horizontal direction of FIG. 9A.

Diodes having a p-i-n structure in the forward direction were formed between each of the magnetoresistive elements as the rectifier elements 52, 53, 54. The layers in the pin structure were deposited by CVD. The p layer was formed under the conditions of 0.5% $B_2H_6/H_2$=100 sccm, $H_2$=100 sccm, and $SiH_4$=100 sccm. The i layer was formed of $SiH_4$ and $H_2$. The n layer was formed under the conditions of 0.5% $PH_3/H_2$=100 sccm, $H_2$=100 sccm, and $SiH_4$=50 sccm. Here, "0.5%" is a percentage relative to $H_2$. A Ti buffer layer was formed between the diode and the magnetoresistive element or the wiring.

The outputs of the individual magnetoresistive elements other than wiring resistance and diode resistance were 120 mV.

The writing operation was performed in the same manner as Example 1.

The reading operation will be described with reference to FIGS. 9 and 24. First, the magnetic memory 101, from which information was to be read, and the comparative magnetic memory R1 were addressed. Then, the word lines 31, 32 were maintained at a ground potential, so that a sense current flowing between the bit line 22 and the word line 32 was the same in magnitude as a sense current flowing between the bit line 21 and the word line 31. As with Example 1, a memory value of the element 11 was determined first, followed by a memory value of the element 12. In this manner, the memory values of two magnetoresistive elements 11, 12 of a single magnetic memory 101 were read.

Example 4

An integrated memory was produced on a glass substrate with magnetic memories, each magnetic memory including a magnetoresistive element having two memory layers as shown in FIG. 10. The integrated memory was provided with a magnetic shield similar to that of Example 1.

The magnetic memories were arranged as shown in FIG. 24. The integrated memory included 256×256 magnetic memories (the total number of memory layers was 256×256×2). By using this group of magnetic memories as a frame, an MRAM of 8 frames was produced.

The magnetoresistive element had the following film configuration:

Lower electrode/Ta(3)/AlO(1.3)/Fe(2)/AlO(1.0)/CoFe(3)/Ru(0.8)/CoFe(3)/PtMn(20)/CoFe(3)/Ru(0.8)/CoFe(3)/AlO(1.06)/Fe(2)/AlO(1.3)/Ta(3)/upper electrode.

In this element, AlO was a tunnel layer, Fe was a memory layer, and AlO in contact with Ta was a bias tunnel layer.

As with Example 1, the multilayer film was heat-treated and then processed in view of unidirectional anisotropy, so that the long side direction of each layer was aligned in the horizontal direction of FIG. 10.

A MR ratio was measured by applying a uniform magnetic field to the element with an external coil. The results showed that the coercive force of the two memory layers (Fe) was about the same. The output changes of the individual memory layers caused by magnetization reversal other than wiring resistance and diode resistance were about 40 mV for the memory layer 73 on the lower electrode side and about 80 mV for the memory layer 3 on the upper electrode side. The output changes were determined in the same manner as Example 2.

As with Example 2, information was written individually into the memory layers of a single element, and the information was read from the memory layers by allowing a sense current to flow from the bit line 21, which also was used as the sense line, to the word line 31.

Example 5

An integrated memory was produced on a CMOS substrate with magnetic memories, each magnetic memory including a multilevel magnetoresistive element as shown in FIG. 3. This example used a two-level magnetoresistive element. The integrated memory was provided with a magnetic shield similar to that of Example 1.

The magnetic memories were arranged as shown in FIG. 24. The integrated memory included 256×256 magnetic memories (the total number of magnetoresistive elements was 256×256×2).

A first magnetoresistive element of each of the magnetic memories was produced with the following layered structure:

Lower electrode/Ta(3)/PtMn(20)/CoFe(3)/Ru(0.9)/CoFe(3)/AlO(1.0)/CoFe(0.5)/NiFe(2)/CoFe(0.5)/AlO(1.0)/CoFe(3)/Ru(0.9)/CoFe(3)/PtMn(20)/Ta(3)/upper electrode.

Subsequently, a second magnetoresistive element was produced with the following layered structure:

Lower electrode/Ta(3)/IrMn(20)/CoFe(3)/Ru(0.9)/CoFe(3)/AlO(1.06)/CoFe(0.5)/NiFe(2)/CoFe(0.5)/AlO(1.06)/CoFe(3)/Ru(0.9)/CoFe(3)/IrMn(20)/Ta(3)/upper electrode.

In these elements, AlO was a tunnel layer, and CoFe(0.5)/NiFe(2)/CoFe(0.5) was a memory layer.

After deposition, the first element was heat-treated under the same conditions as those in Example 1 so as to impart unidirectional anisotropy to PtMn. Then, the surface shape of each layer was processed to 0.2 µm×0.3 µm so that the long side direction was parallel to the direction of the unidirectional anisotropy (i.e., the long side direction of each layer was aligned in the horizontal direction of FIG. 3).

For the second element, unidirectional anisotropy was imparted perpendicular to the longitudinal direction of PtMn by depositing IrMn in a magnetic field. Then, the surface shape of each layer was processed to 0.2 μm×0.3 μm so that the long side direction was parallel to the direction of the unidirectional anisotropy (i.e., the short side direction of each layer was aligned in the horizontal direction of FIG. 3). The integrated memory thus produced was referred to as "memory A".

For comparison, a first element was produced in the same manner as described above, and a second element was produced in the same manner as the first element except that AlO(1) was replaced by AlO(1.06). The integrated memory thus produced was referred to as "memory B". The direction of unidirectional anisotropy and the long side direction of each layer in the first element matched with those in the second element (i.e., the long side directions of the first and second elements were aligned in the horizontal direction of FIG. 3).

In both of the integrated memories, the outputs of the individual magnetoresistive elements other than wiring resistance and CMOS resistance were 60 mV for the first level and 120 mV for the second level.

For each of the integrated memories, magnetization reversal was repeated in such a manner that a magnetic field produced by a bit line 21 was applied to the first element in the short side direction of each layer, and a magnetic field produced by a word line 31 was applied further to the first element. Then, the probability of recording errors in the second element was measured. The results showed that $10^{-8}$/cycle for the memory A and $10^{-6}$/cycle for the memory B. Here, the recording errors included errors during reading.

Another memory was produced to make further measurement. The result showed that when the angle between the long side directions of the first and second elements ranged from 20° to 90°, recording errors were reduced notably. It was advantageous to a reduction in recording errors if the elements that were adjacent in the in-plane direction also had different long side directions.

Figure 26:
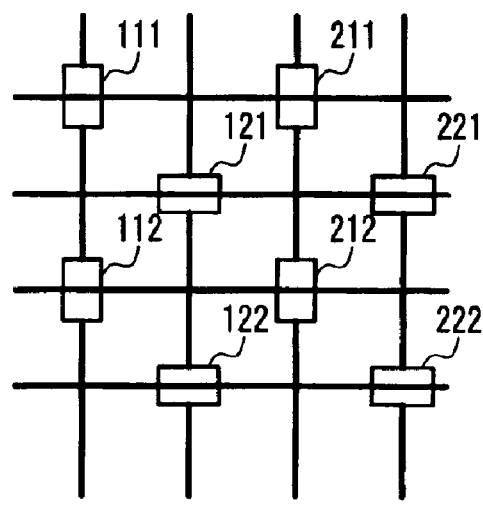
FIG. 26 is a plan view showing another example of the arrangement of elements in a magnetic memory device of the present invention.
Figure 26:
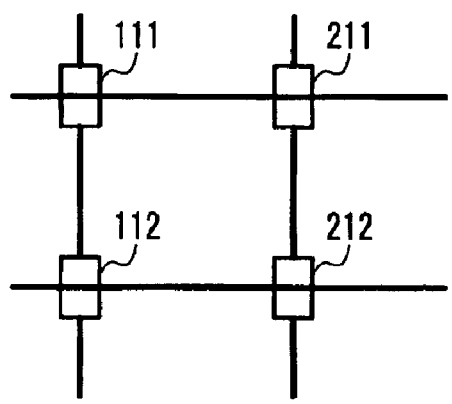
Figure 26:
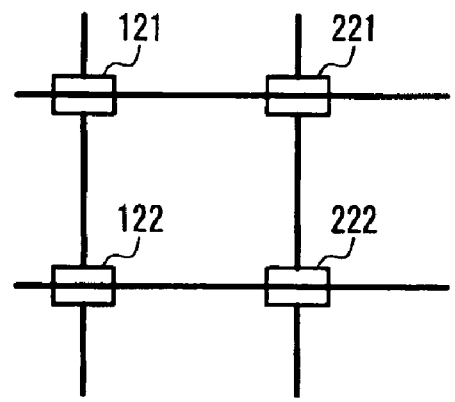

As shown in FIG. 26, when the elements 111, 112, 211, 212 in the first level and the elements 121, 122, 221, 222 in the second level were arranged so as not to overlap each other in the thickness direction, the reading accuracy was improved.

An integrated memory was produced in the same manner as described above using the following elements.

Memory I
First Level
Lower electrode/Ta(3)/PtMn(20)/CoFe(3)/Ru(0.9)/CoFe(3)/AlO(1.0)/NiFe(2)/Ru(0.9)/NiFe(4)/AlO(1.0)/CoFe(3)/PtMn(20)/Ta(3)/upper electrode
Second Level
Lower electrode/Ta(3)/IrMn(20)/CoFe(3)/Ru(0.9)/CoFe(3)/AlO(1.06)/NiFe(2)/Ru(0.9)/NiFe(4)/AlO(1.06)/CoFe(3)/PtMn(20)/Ta(3)/upper electrode
Memory II
First Level
Lower electrode/Ta(3)/PtMn(20)/CoFe(3)/Ru(0.9)/CoFe(3)/AlO(1.0)/NiFe(2)/Ru(0.9)/NiFe(2)/Ru(0.9)/NiFe(2)/AlO(1.0)/CoFe(3)/Ru(0.9)/CoFe(3)/PtMn(20)/Ta(3)/upper electrode
Second Level
Lower electrode/Ta(3)/IrMn(20)/CoFe(3)/Ru(0.9)/CoFe(3)/AlO(1.06)/NiFe(2)/Ru(0.9)/NiFe(2)/Ru(0.9)/NiFe(2)/AlO(1.06)/CoFe(3)/Ru(0.9)/CoFe(3)/PtMn(20)/Ta(3)/upper electrode
Memory III
First Level
Lower electrode/Ta(3)/PtMn(20)/CoFe(3)/Ru(0.9)/CoFe(3)/AlO(1.0)/NiFe(1)/CoFe(1)/AlO(1.0)/CoFe(3)/Ru(0.9)/CoFe(3)/PtMn(20)/Ta(3)/upper electrode
Second Level
Lower electrode/Ta(3)/IrMn(20)/CoFe(3)/Ru(0.9)/CoFe(3)/AlO(1.06)/NiFe(1)/CoFe(1)/AlO(1.06)/CoFe(3)/Ru(0.9)/CoFe(3)/PtMn(20)/Ta(3)/upper electrode
Memory IV
First Level
Lower electrode/Ta(3)/PtMn(20)/CoFe(3)/Ru(0.9)/CoFe(3)/AlO(1.0)/NiFe(2)/AlO(1.0)/CoFe(3)/Ru(0.9)/CoFe(3)/PtMn(20)/Ta(3)/upper electrode
Second Level
Lower electrode/Ta(3)/IrMn(20)/CoFe(3)/Ru(0.9)/CoFe(3)/AlO(1.06)/NiFe(2)/AlO(1.06)/CoFe(3)/Ru(0.9)/CoFe(3)/PrMn(20)/Ta(3)/upper electrode The memories I to III used a multilayer film as a memory layer. For the memory I, NiFe(2)/Ru(0.9)/NiFe(4) was a memory layer. For the memory II, NiFe(2)/Ru(0.9)/NiFe(4)/Ru(0.9)/NiFe(4) was a memory layer. For the memory III, NiFe(1)/CoFe(1) was a memory layer. On the other hand, the memory IV included NiFe(2) as a memory layer.

After deposition, the first element of each of the memories was heat-treated in a magnetic field of 5 kOe at 280° C. for 1 hour so as to impart unidirectional anisotropy to PtMn. Then, the shape of the element for each layer was processed to 0.2 μm×0.3 μm so that the long side direction was parallel to the direction of the unidirectional anisotropy (i.e., the long side direction of each layer was aligned in the horizontal direction of FIG. 3A).

For the second element of each of the memories, unidirectional anisotropy was imparted perpendicular to the longitudinal direction of PtMn by depositing IrMn in a magnetic field. Then, the shape of the element for each layer was processed to 0.2 μm×0.3 μm so that the long side direction was parallel to the direction of the unidirectional anisotropy (i.e., the short side direction of each layer was aligned in the horizontal direction of FIG. 3A).

The outputs of the individual elements other than wiring resistance and CMOS resistance were 60 mV for the first level and 120 mV for the second level.

For each of the memories, magnetization reversal was repeated in such a manner that a magnetic field produced by a bit line 21 was applied to the first element in the short side direction of each layer, and a magnetic field produced by a word line 31 was applied further to the first element. Then, the probability of recording errors in the second element was measured. The results showed that $10^{-8}$/cycle for the memories I to III and $10^{-6}$/cycle for the memory IV. Here, the recording errors included errors during reading.

Like the memories I to III, when the memory layer is a multilayer film of at least two magnetic films or a multilayer film of at least two magnetic films and at least one nonmagnetic film, the switching magnetization curve of the memory layer deviates from a simple curve having fourth order symmetry. This may lead to a reduction in recording errors.

Example 6

Figure 27:
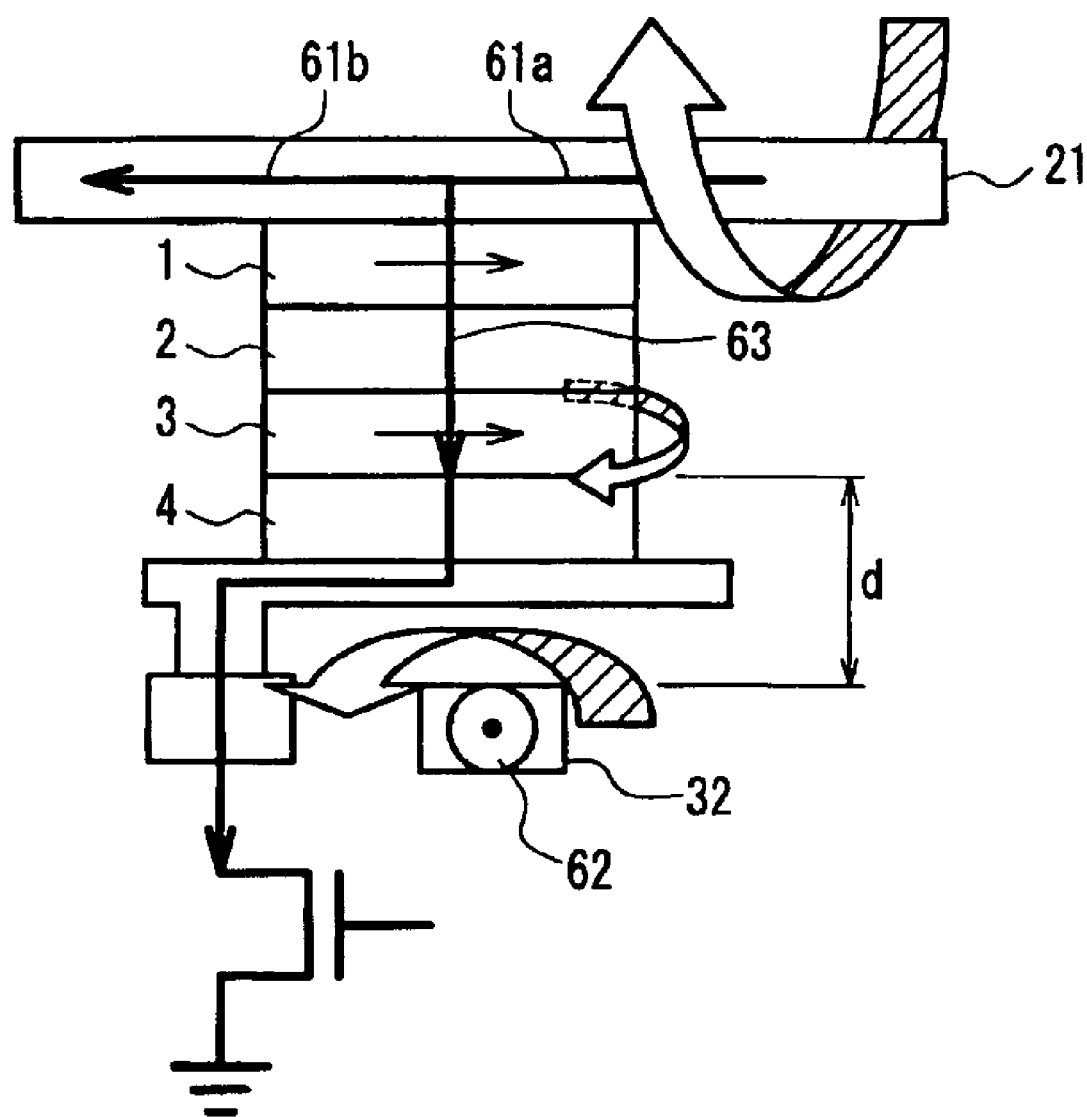
FIG. 27 is a cross-sectional view of a magnetic memory that was produced in an example of the present invention.

An MRAM was produced on a CMOS substrate with magnetoresistive elements arranged in matrix form, each magnetoresistive element having a configuration as shown in FIG. 27. This MRAM was used to study recording methods.

The magnetoresistive element had the following configuration:

Lower electrode/Ta(3)/AlO(1.3)/Fe(2)/AlO(1.0)/CoFe(3)/Ru(0.9)/CoFe(3)/PtMn(20)/Ta(3)/upper electrode.

In this element, AlO(1.3) was a bias tunnel layer 4, Fe(2) was a memory layer 3, AlO(1.0) was a tunnel layer 2, and CoFe(3)/Ru(0.9)/CoFe(3) was a pinned layer 1. PtMn(20) was an antiferromagnetic layer (not shown).

After deposition, the multilayer film was heat-treated in a magnetic field of 5 kOe at 280° C. for 1 hour so as to impart unidirectional anisotropy to PtMn. Then, the shape of the element for each layer was processed to 0.1 μm×0.15 μm so that the long side direction was parallel to the direction of the unidirectional anisotropy (i.e., the long side direction of each layer was aligned in the horizontal direction of FIG. 27).

In this example, different elements were produced by appropriately varying a distance d between the top of a word line 32 and the bottom of the memory layer 3 within the range of 40 to 100 nm while adjusting the position of the word line.

First, a synthetic magnetic field produced by currents 61, 62 flowing through the word line 32 and a bit line 21 was used to reverse the magnetization of the memory layer. The magnetization reversal became more difficult as the distance d increased.

When a current 63 further flowed through the element for magnetization reversal, the probability of recording errors was reduced over the entire range of d. In this case, the direction of a magnetic field produced by a current 61a flowing through the bit line 21 before splitting matched with the direction of a magnetic field produced by the current 63.

When the currents 61a, 61b flowed through the bit line 21 in opposite directions so that the direction of a magnetic field produced by the current before splitting was opposite to the direction of a magnetic field produced by the current after splitting, recording errors were not reduced. The current flowing through the bit line before splitting is relatively large compared with the current after splitting. Therefore, the magnetic field produced by the current before splitting may prevent the current that perpendicularly flows through the memory layer from assisting the magnetization reversal.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A magnetic memory comprising:
    two or more memory layers and two or more tunnel layers that are stacked in a thickness direction of the layers,
    wherein the two or more memory layers are connected electrically in series,
    a group of first layers comprises at least one layer selected from the two or more memory layers,
    a group of second layers comprises at least one layer selected from the two or more memory layers, and
    a resistance change caused by magnetization reversal in the group of first layers differs from a resistance change caused by magnetization reversal in the group of second layers.

2. The magnetic memory according to claim 1, wherein the resistance change of the group of first layers is represented by $\Delta R_1$ and the resistance change of the group of second layers is represented by $\Delta R_2$, and $\Delta R_1$ and $\Delta R_2$ satisfy $$\Delta R_1 \times 2 \leq \Delta R_2$$

where $\Delta R_1 < \Delta R_2$.

3. The magnetic memory according to claim 1, comprising:
    two or more magnetoresistive elements; and
    two or more recording conductors,
    wherein each of the two or more magnetoresistive elements comprises at least one layer selected from the two or more memory layers and at least one layer selected from the two or more tunnel layers, and
    at least one recording conductor selected from the two or more recording conductors is arranged between a pair of adjacent magnetoresistive elements selected from the two or more magnetoresistive elements.

4. The magnetic memory according to claim 1, comprising:
    a magnetoresistive element comprising at least two layers selected from the two or more memory layers,
    wherein the at least two layers include two memory layers with different resistance changes due to magnetization reversal.

5. The magnetic memory according to claim 1, wherein the two or more tunnel layers include two tunnel layers with different thicknesses.

6. The magnetic memory according to claim 1, wherein a resistance change of a Nth memory layer selected from the two or more memory layers is represented by $\Delta R_N$, a minimum value of $\Delta R_N$ is represented by $\Delta R_{min}$, and a maximum value of $\Delta R_N$ is represented by $\Delta R_{max}$, and $\Delta R_{min}$ and $\Delta R_{max}$ satisfy $$\Delta R_{max} \geq \Delta R_{min} \times 2^{N-1}$$

where N is an integer of not less than 2.

7. The magnetic memory according to claim 1, wherein a resistance change of a Nth memory layer selected from the two or more memory layers is represented by $\Delta R_N$ and a Mth smallest $\Delta R_N$ is represented by $\Delta R_M$, and $\Delta R_M$ satisfies $$\Delta R_M \times 2 \leq \Delta R_{M+1}$$

where N is an integer of not less than 2 and M is an integer of 1 to (N−1).

8. The magnetic memory according to claim 1, wherein the two or more memory layers include a pair of memory layers that are adjacent to each other in the thickness direction of the layers so that a direction of an easy axis of magnetization of one of said pair of memory layers differs from a direction of an easy axis of magnetization of the other of said pair of memory layers.

9. The magnetic memory according to claim 8, wherein an angle between the easy axes of magnetization ranges from 20° to 90°.

10. The magnetic memory according to claim 8, wherein at least one of the pair of memory layers is a laminate that comprises two or more magnetic layers.

11. The magnetic memory according to claim 1, comprising:
    a nonlinear element connected electrically to the two or more memory layers.

12. A magnetic memory device comprising a plurality of magnetic memories according to claim 1,
    wherein the magnetic memories are arranged in an in-plane direction of the layers.

13. The magnetic memory device according to claim 12, comprising a pair of memory layers that are adjacent to each other in the in-place direction of the layers so that a direction of an easy axis of magnetization of one of said pair of memory layers differs from an direction of an easy axis of magnetization of the other of said pair of memory layers.

14. A system LSI comprising the magnetic memories according to claim 1.

15. A method for driving a magnetic memory comprising:
driving a magnetic memory comprising two or more memory layers and two or more tunnel layers that are stacked in a thickness direction of the layers, wherein the two or more memory layers are connected electrically in series, a group of first layers comprises at least one layer selected from the two or more memory layers, a group of second layers comprises at least one layer selected from the two or more memory layers, and a resistance change caused by magnetization reversal in the group of first layers differs from a resistance change caused by magnetization reversal in the group of second layers,
wherein magnetization reversal of at least one layer selected from the two or more memory layers is performed using a magnetic field that is produced by a plurality of currents including a current flowing through the at least one layer in its thickness direction.

16. The method according to claim 15, wherein the plurality of currents includes a second current, where the current flowing in the thickness direction is identified as a first current, and
the second current flows in an in-plane direction of the two or more memory layers and produces a magnetic field along a magnetization direction after the magnetization reversal.

17. The method according to claim 16, wherein application of the second current is started after application of the first current is started.

18. The method according to claim 17, wherein the plurality of currents further includes a third current that flows in the in-plane direction, but in a different direction from the second current, and
application of the second current is started after application of the third current is started.

19. The method according to claim 16, wherein the plurality of currents further includes a third current that flows in the in-plane direction, but in a different direction from the second current, and
the first current is supplied after separation from the third current.

20. The method according to claim 15, wherein magnetizations of two layers selected from the two or more memory layers are reversed simultaneously by application of at least a magnetic field produced by a current flowing through a conductor that lies between the two layers.

21. A method for driving a magnetic memory comprising:
driving a magnetic memory comprising a memory layer, wherein magnetization reversal of the memory layer is performed using a magnetic field that is produced by a plurality of currents including a current flowing through the memory layer in its thickness direction.

22. The method according to claim 21, wherein the plurality of currents includes a second current, where the current flowing in the thickness direction is identified as a first current, and
the second current flows in an in-plane direction of the memory layer and produces a magnetic field along a magnetization direction after the magnetization reversal.

23. The method according to claim 22, wherein application of the second current is started after application of the first current is started.

24. The method according to claim 23, wherein the plurality of currents further includes a third current that flows in the in-plane direction, but in a different direction from the second current, and
application of the second current is started after application of the third current is started.

25. The method according to claim 22, wherein the plurality of currents further includes a third current that flows in the in-plane direction, but in a different direction from the second current, and
the first current is supplied after separation from the third current.

* * * * *